US011562994B2

(12) United States Patent
Baruah et al.

(10) Patent No.: US 11,562,994 B2
(45) Date of Patent: Jan. 24, 2023

(54) DUMMY CELL AND TAP CELL LAYOUT STRUCTURE

(71) Applicant: QUALCOMM Incorporated, San Diego, CA (US)

(72) Inventors: Kaushik Baruah, Bangalore (IN); Thomas Hua-Min Williams, Irvine, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 17/362,746

(22) Filed: Jun. 29, 2021

(65) Prior Publication Data

US 2022/0415874 A1    Dec. 29, 2022

(51) Int. Cl.
*H01L 27/02* (2006.01)
*H01L 27/092* (2006.01)

(52) U.S. Cl.
CPC ...... *H01L 27/0207* (2013.01); *H01L 27/0924* (2013.01)

(58) Field of Classification Search
CPC .......... H01L 27/0207; H01L 27/0924
See application file for complete search history.

(56) References Cited

U.S. PATENT DOCUMENTS 10,163,884 B1 * 12/2018 Chintarlapalli Reddy ................ H01L 27/0207
2017/0194319 A1    7/2017 Xu
2017/0243888 A1    8/2017 Shimbo
2019/0173473 A1 *  6/2019 Sah ...................... H03K 19/0948
2020/0243128 A1    7/2020 Sato
2021/0272984 A1 *  9/2021 Huang ................ H01L 27/0207
2021/0328056 A1 * 10/2021 Baek ...................... H01L 27/092
2022/0037365 A1 *  2/2022 Huang .................. G06F 30/392

OTHER PUBLICATIONS

International Search Report and Written Opinion—PCT/US2022/033528—ISA/EPO—dated Oct. 10, 2022.

* cited by examiner

*Primary Examiner* — Karen Kusumakar
*Assistant Examiner* — Adam S Bowen
(74) *Attorney, Agent, or Firm* — Procopio, Cory, Hargreaves & Savitch LLP

(57) ABSTRACT

A MOS IC includes a first circuit including a first plurality of nMOS devices, a first p-tap cell, and a first dummy nMOS cell, and a second circuit including a first plurality of pMOS devices, a first dummy pMOS cell, and a first n-tap cell. The nMOS/pMOS devices are spaced apart in a first direction. The first p-tap cell and the first dummy nMOS cell are adjacent to each other in the first direction between the nMOS devices. The first dummy pMOS cell and the first n-tap cell are adjacent to each other in the first direction between the pMOS devices. The pMOS devices are adjacent to the nMOS devices in a second direction orthogonal to the first direction. The first p-tap cell/the first dummy pMOS cell and the first dummy nMOS cell/the first n-tap cell are respectively adjacent to each other in the second direction.

24 Claims, 11 Drawing Sheets

DUMMY CELL AND TAP CELL LAYOUT STRUCTURE

TECHNICAL FIELD

The present disclosure relates generally to a layout structure, and more particularly, to a dummy cell and tap cell layout structure.

INTRODUCTION

A cell device is an integrated circuit (IC) that implements digital logic. Such cell device may be reused multiple times within an application-specific IC (ASIC). An ASIC, such as a system-on-a-chip (SoC) device, may contain thousands to millions of cell devices. A typical IC includes a stack of sequentially formed layers. Each layer may be stacked or overlaid on a prior layer and patterned to form the shapes that define transistors (e.g., field effect transistors (FETs), fin FETs (FinFETs), gate-all-around (GAA) FETs (GAAFETs), and/or other multigate FETs) and connect the transistors into circuits. Cell devices may be arranged based on a particular layout structure. There is currently a need for improved layout structures.

BRIEF SUMMARY

In an aspect of the disclosure, a metal oxide semiconductor (MOS) IC includes a first circuit and a second circuit. The first circuit includes a first plurality of n-type MOS (nMOS) devices, a first p-type tap (p-tap) cell, and a first dummy nMOS cell. The first plurality of nMOS devices is spaced apart in a first direction. The first p-tap cell and the first dummy nMOS cell are adjacent to each other in the first direction between the first plurality of nMOS devices. The first p-tap cell is configured to be coupled to a first voltage source. The second circuit includes a first plurality of p-type MOS (pMOS) devices, a first dummy pMOS cell, and a first n-type tap (n-tap) cell. The first plurality of pMOS devices is adjacent to the first plurality of nMOS devices in a second direction orthogonal to the first direction. The first plurality of pMOS devices is spaced apart in the first direction. The first dummy pMOS cell and the first n-tap cell are adjacent to each other in the first direction between the first plurality of pMOS devices. The first n-tap cell is configured to be coupled to a second voltage source. The first p-tap cell and the first dummy pMOS cell are adjacent to each other in the second direction. The first dummy nMOS cell and the first n-tap cell are adjacent to each other in the second direction.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts. Apparatuses and methods will be described in the following detailed description and may be illustrated in the accompanying drawings by various blocks, modules, components, circuits, steps, processes, algorithms, elements, etc.

Figure 1:
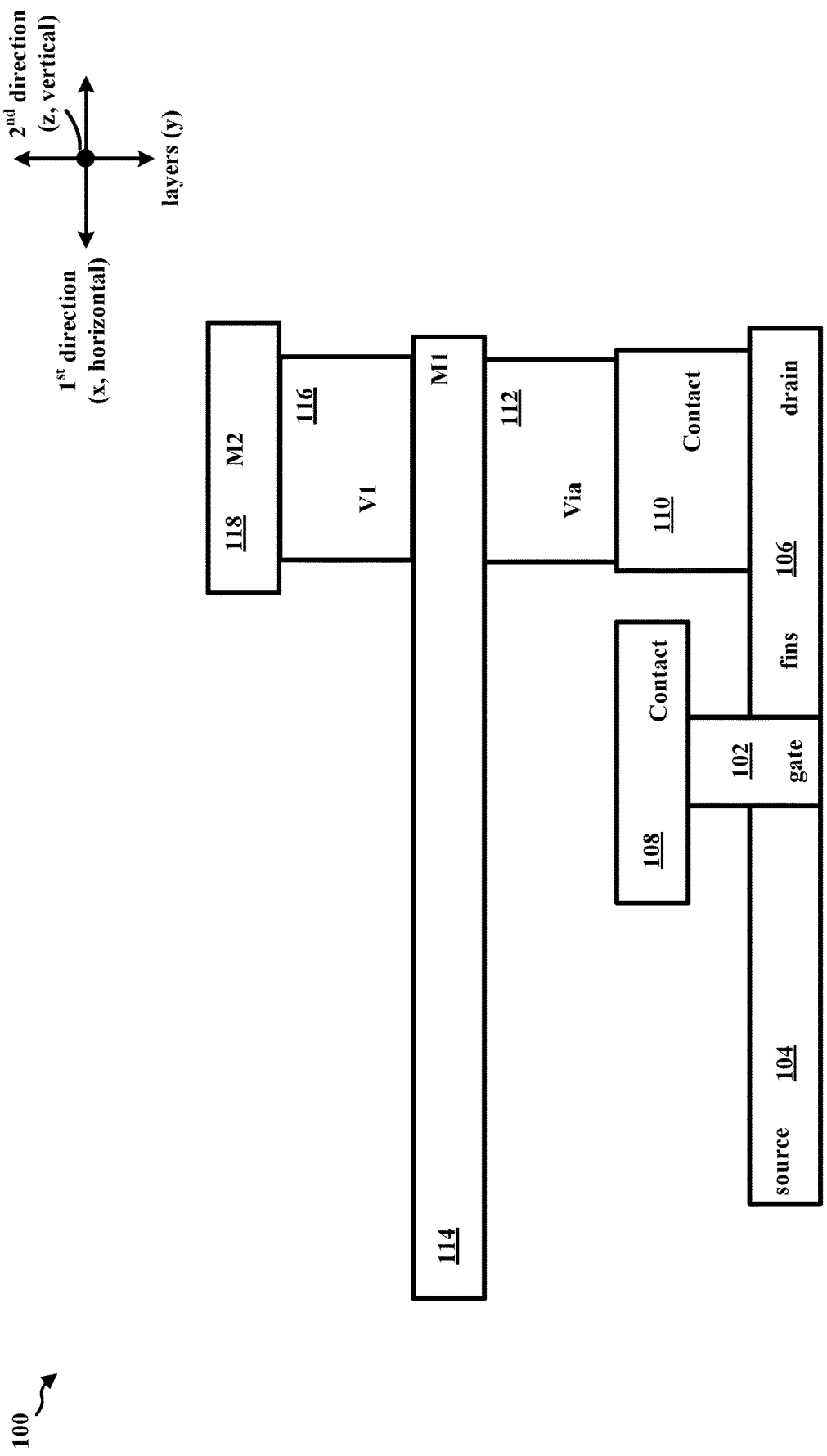
FIG. 1 is a first diagram illustrating a side view of various layers within a cell of an IC.

FIG. 1 is a first diagram 100 illustrating a side view of various layers within a cell device and IC. The various layers change in the y direction. As illustrated in FIG. 1, a transistor has a gate 102 (which may be referred to as POLY in some instances even though the gate may be formed of metal, polysilicon, or a combination of polysilicon and metal), a source 104, and a drain 106. The source 104 and the drain 106 may be formed by fins. The gate 102 may extend in a second direction (e.g., vertical direction along the z axis coming out of the page), and the fins may extend in a first direction orthogonal to the second direction (e.g., horizontal direction along the x axis). A contact layer interconnect 108 (also referred to as a metal POLY (MP) layer interconnect, or contact B (CB) layer interconnect) may contact the gate 102. A contact layer interconnect 110 (also referred to as a metal diffusion (MD) layer interconnect, or contact A (CA) layer interconnect) may contact the source 104 and/or the drain 106. A via 112 (also referred to as via A (VA)) may contact the contact layer interconnect 110. A metal 1 (M1) layer interconnect 114 may contact the via 112. The M1 layer interconnect 114 may extend in the first direction only (i.e., unidirectional in the first direction). A via V1 116 may contact the M1 layer interconnect 114. A metal 2 (M2) layer interconnect 118 may contact the via V1 116. The M2 layer interconnect 118 may extend in the second direction only (i.e., unidirectional in the second direction). Higher layers include a via layer including vias V2 and a metal 3 (M3) layer including M3 layer interconnects. The M3 layer interconnects may extend in the first direction. A cell device may be implemented with FinFETs (as illustrated), GAAFETs, or other multigate FETs. For a continuous oxide diffusion (OD) region across multiple devices, the fins are continuous (in the first direction) across the multiple devices. For a discontinuous OD region across multiple devices, the fins are separate at a diffusion break (e.g., single/double diffusion break extending in the second direction) between different sets of the multiple devices.

Figure 2:
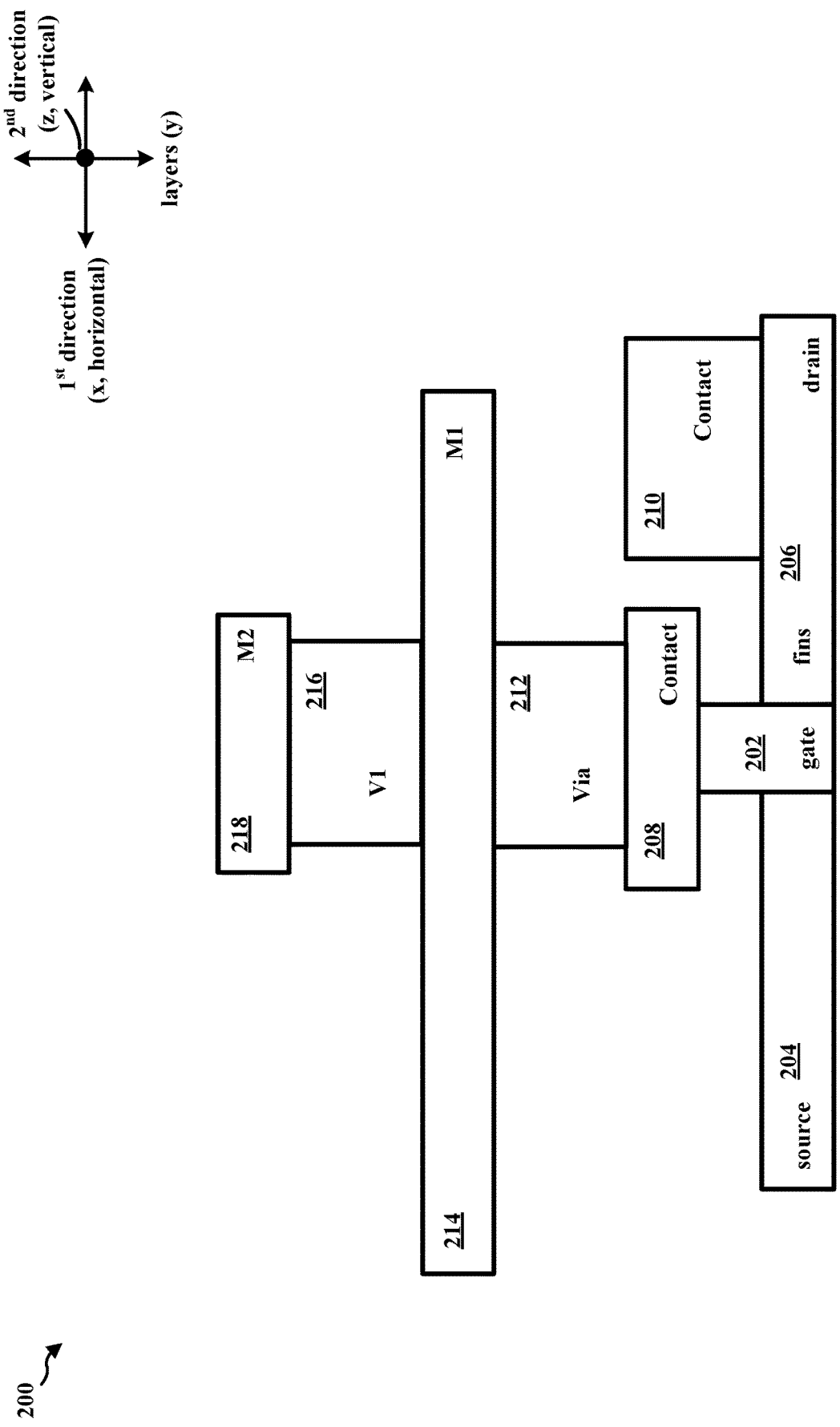
FIG. 2 is a second diagram illustrating a side view of various layers within a cell of an IC.

FIG. 2 is a second diagram 200 illustrating a side view of various layers within a standard cell and IC. The various layers change in the y direction. As illustrated in FIG. 2, a transistor has a gate 202, a source 204, and a drain 206. The source 204 and the drain 206 may be formed by fins. The gate 202 may extend in a second direction (e.g., vertical direction along the z axis coming out of the page), and the fins may extend in a first direction orthogonal to the second direction (e.g., horizontal direction along the x axis). A contact layer interconnect 208 (also referred to as CB layer interconnect) may contact the gate 202. A contact layer interconnect 210 (also referred to as CA layer interconnect) may contact the source 204 and/or the drain 206. A via 212 (also referred to as via B (VB)) may contact the contact layer interconnect 208. An M1 layer interconnect 214 may contact the via 212. The M1 layer interconnect 214 may extend in the first direction only (i.e., unidirectional in the first direction). A via V1 216 may contact the M1 layer interconnect 214. An M2 layer interconnect 218 may contact the via V1 216. The M2 layer interconnect 218 may extend in the second direction only (i.e., unidirectional in the second direction). Higher layers include a via layer including vias V2 and an M3 layer including M3 layer interconnects. The M3 layer interconnects may extend in the first direction. A cell device may be implemented with FinFETs (as illustrated), GAAFETs, or other multigate FETs. For a continuous OD region across multiple devices, the fins are continuous (in the first direction) across the multiple devices. For a discontinuous OD region across multiple devices, the fins are separate at a diffusion break (e.g., single/double diffusion break extending in the second direction) between different sets of the multiple devices.

Figure 3:
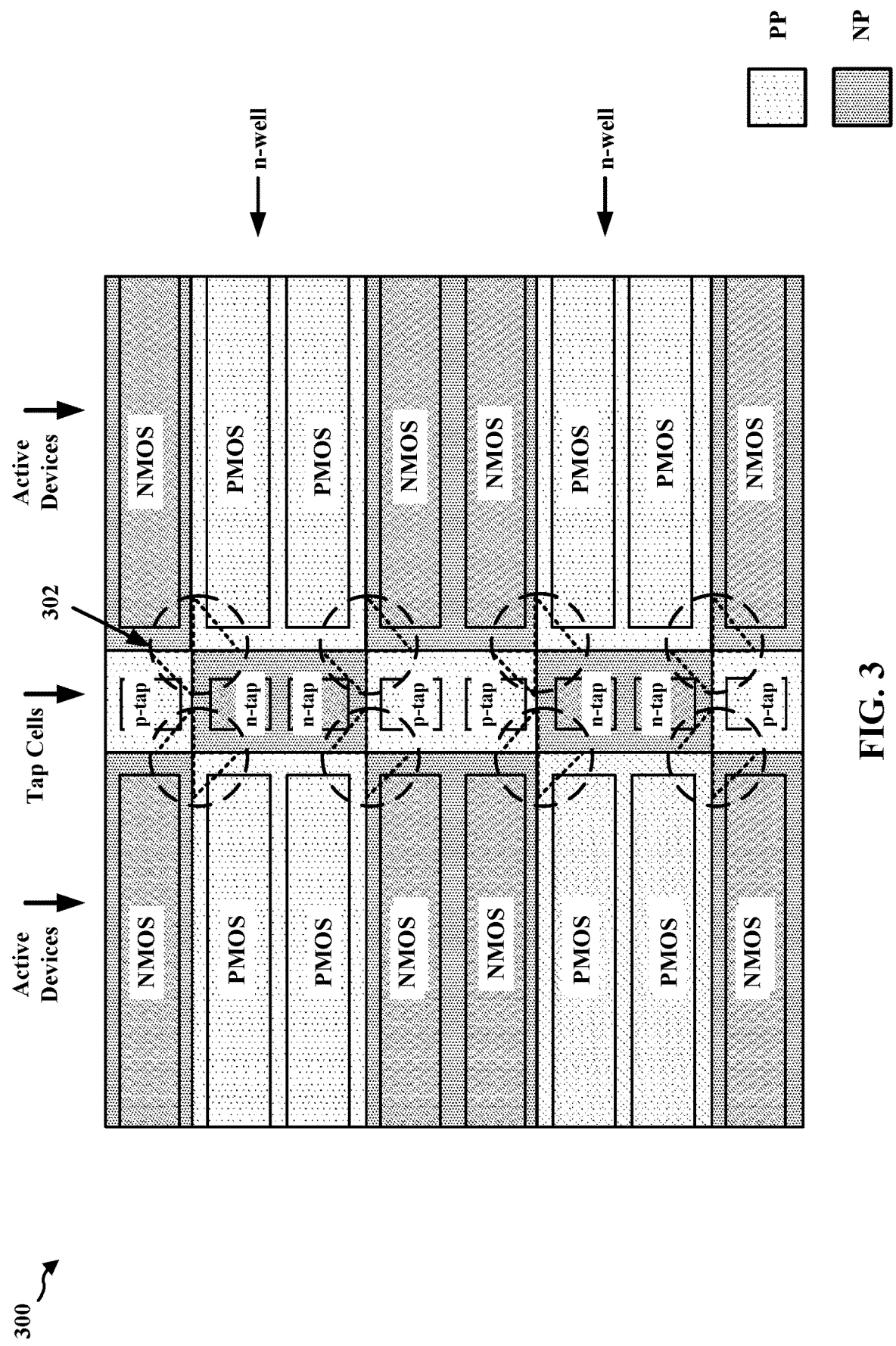
FIG. 3 is a diagram conceptually illustrating a top-view of a tap cell layout structure.

FIG. 3 is a diagram 300 conceptually illustrating a top-view of a tap cell layout structure. A cell device may include pMOS devices and/or nMOS devices. The nMOS devices include n-type doped (n+) source and drain regions. The n+source and drain regions may be referred to as n-plus (NP) implant layers. Each set of nMOS devices is illustrated by an NP layer with an OD layer on the NP layer. The pMOS devices include p-type doped (p+) source and drain regions. The p+source and drain regions may be referred to as p-plus (PP) implant layers. Each set of pMOS devices is illustrated by a PP layer with an OD layer on the PP layer. Of an IC, tap cells (also referred to as guard tap cells) may be located adjacent to a set of pMOS devices and to a set of nMOS devices to provide body connections to the pMOS devices and to the nMOS devices, respectively. A p-tap cell includes a p-type doped (p+) region and provides a body connection for a set of nMOS devices. The p+region of the p-tap cell may be referred to as a PP implant layer. Each p-tap cell is illustrated by a PP layer with an OD layer on the PP layer. An n-tap cell includes an n-type doped (n+) region and provides a body connection for a set of pMOS devices. The n+region of the n-tap cell may be referred to as an NP implant layer. Each n-tap cell is illustrated by an NP layer with an OD layer on the NP layer. A set of pMOS devices and adjacent n-tap cells may be within an n-type well (n-well), assuming the IC is implemented with a p-type substrate.

For some fabrication processes, design rule check (DRC) violations may be encountered at corner areas 302 (see markers within the circles 302 illustrating the four-corner areas, with PP, NP, PP, NP layers meeting at each corner) of the NP layers and PP layers, where PP layers of a set of pMOS devices and a p-tap cell are diagonal from each other and NP layers of a set of nMOS devices and an n-tap cell are diagonal from each other. Specifically, the four-corner areas are defined by 90° edges of an nMOS device (NP), a p-tap cell (PP), an n-tap cell (NP), and a pMOS device (PP) all meeting at one corner. The DRC violations may occur for the illustrated corner case abutment of nMOS devices, pMOS devices, and corresponding tap cells, and may report width and spacing errors in association with the corner case abutment of the NP/PP layers. To avoid such DRC violations, a dummy cell and tap cell layout structure is provided below with respect to FIGS. 4-11.

Figure 4:
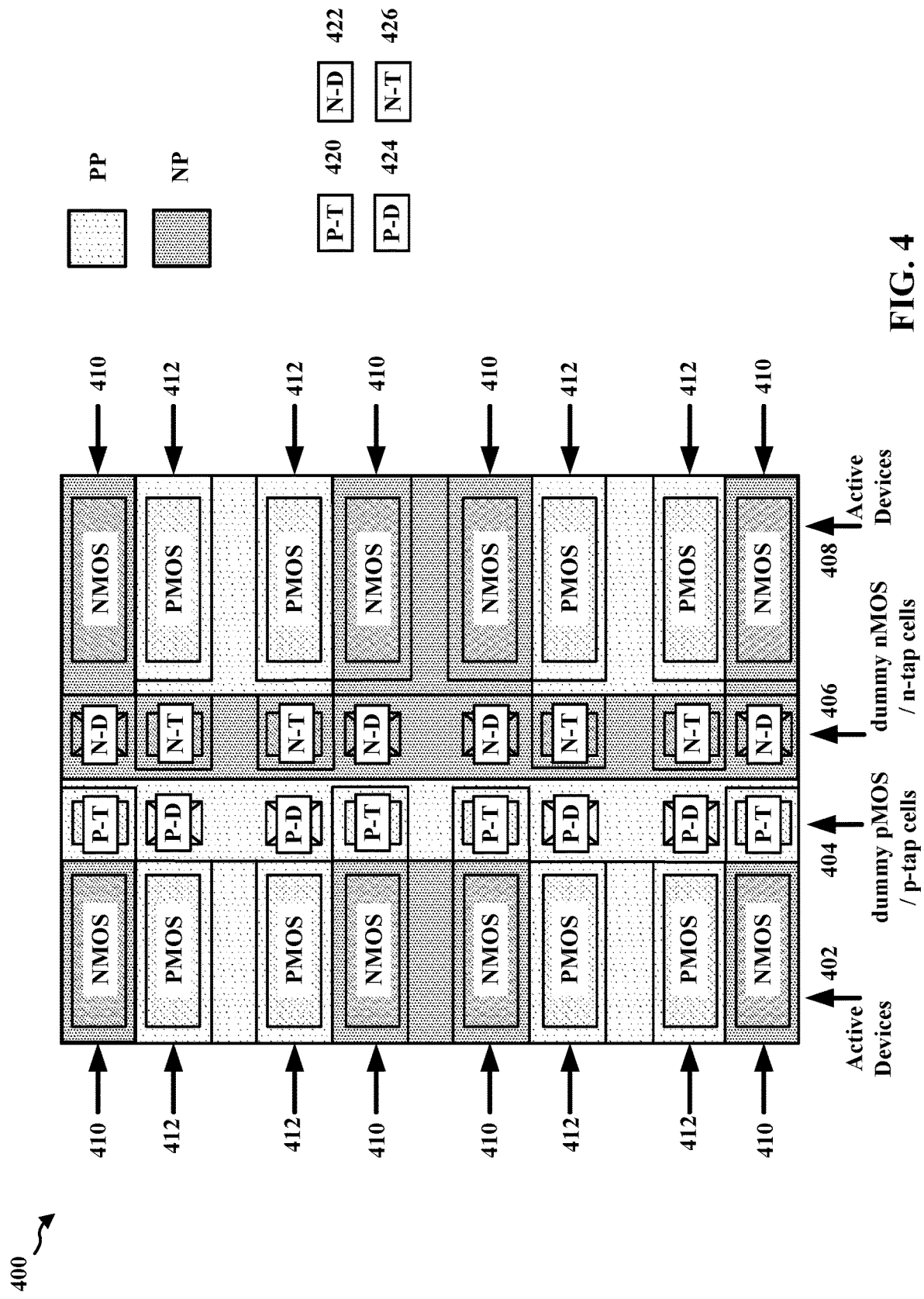
FIG. 4 is a first diagram conceptually illustrating a top-view of a dummy cell and tap cell layout structure.

FIG. 4 is a first diagram 400 conceptually illustrating a top-view of a dummy cell and tap cell layout structure. The illustrated dummy cell and tap cell layout structure is a subsection of a larger layout structure, where the pattern illustrated may be repeated. The illustrated dummy cell and tap cell layout structure includes four columns of devices/cells, including a first column 402 of active devices, a second column 404 of PP implant cells including dummy pMOS cells (P-D)/p-tap cells (P-T), a third column 406 of NP implant cells including dummy nMOS cells (N-D)/n-tap cells (N-T), and a fourth column 408 of active devices. The active devices in the columns 402, 408 include both nMOS devices 410 and pMOS devices 412. In an alternative configuration, the columns 404, 406 may be swapped, with the NP implant cells in the second column 404 and the PP implant cells in the third column 406. Such a layout structure can be obtained by flipping/mirroring the illustrated layout structure, or rotating the illustrated layout structure clockwise/counterclockwise by 180°. The active devices in the columns 402, 408 are illustrated with pairs of adjacent nMOS devices 410 interleaved with pairs of adjacent pMOS devices 412. Generally, each row of active devices may include n adjacent nMOS devices 410 interleaved with m adjacent pMOS devices 412, where n≥1 and m≥1 (see FIG. 11). In the illustrated dummy cell and tap cell layout structure, n=2 and m=2.

As illustrated in the dummy cell and tap cell layout structure, a dummy nMOS cell 422 is located adjacent to each p-tap cell 420, and a dummy pMOS cell 424 is located adjacent to each n-tap cell 426, where cells with PP layers are in one column and cells with NP layers are in an adjacent column. Through placement of the dummy nMOS cells 422 and the dummy pMOS cells 424 within the layout structure, the four-corner areas (see 302) with the PP, NP, PP, NP layers meeting at one corner can be avoided. Accordingly, by avoiding such four-corner areas, associated DRC violations can be avoided. Avoid DRC violations can improve the yield of corresponding fabricated MOS ICs and performance of the fabricated MOS ICs.

Figure 5:
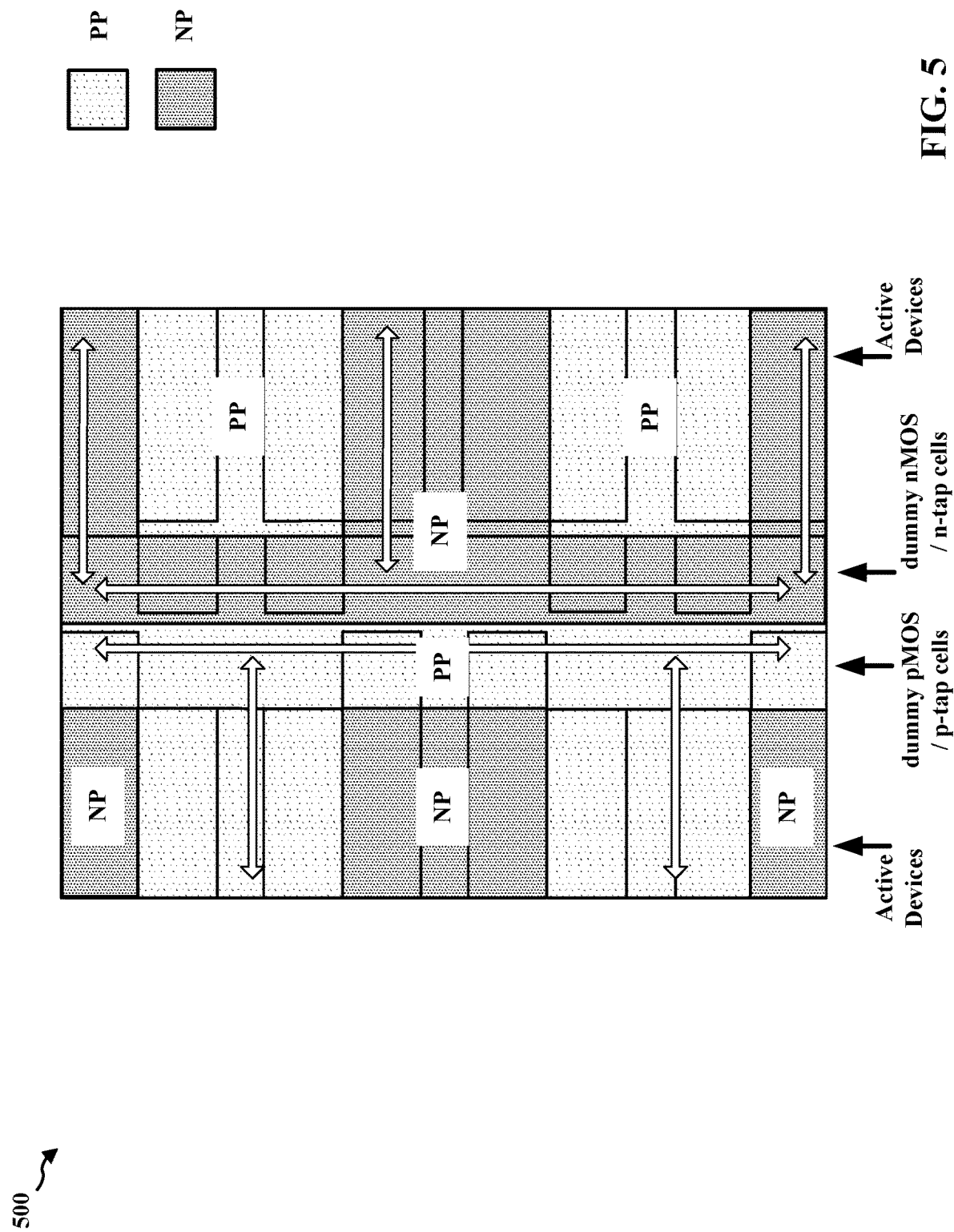
FIG. 5 is a second diagram conceptually illustrating a top-view of a dummy cell and tap cell layout structure.

FIG. 5 is a second diagram 500 conceptually illustrating a top-view of a dummy cell and tap cell layout structure. As illustrated in FIG. 5, the addition of the dummy pMOS cells 424 and dummy nMOS cells 422 within the layout structure as illustrated in FIG. 4 provides a layout structure that excludes the four-corner areas of the NP/PP layers. As illustrated by the arrows in FIG. 5, the PP/NP layers each have a C-shape within the layout structure. Four-corner areas of the NP/PP layers are non-existent in the configuration.

Figure 6:
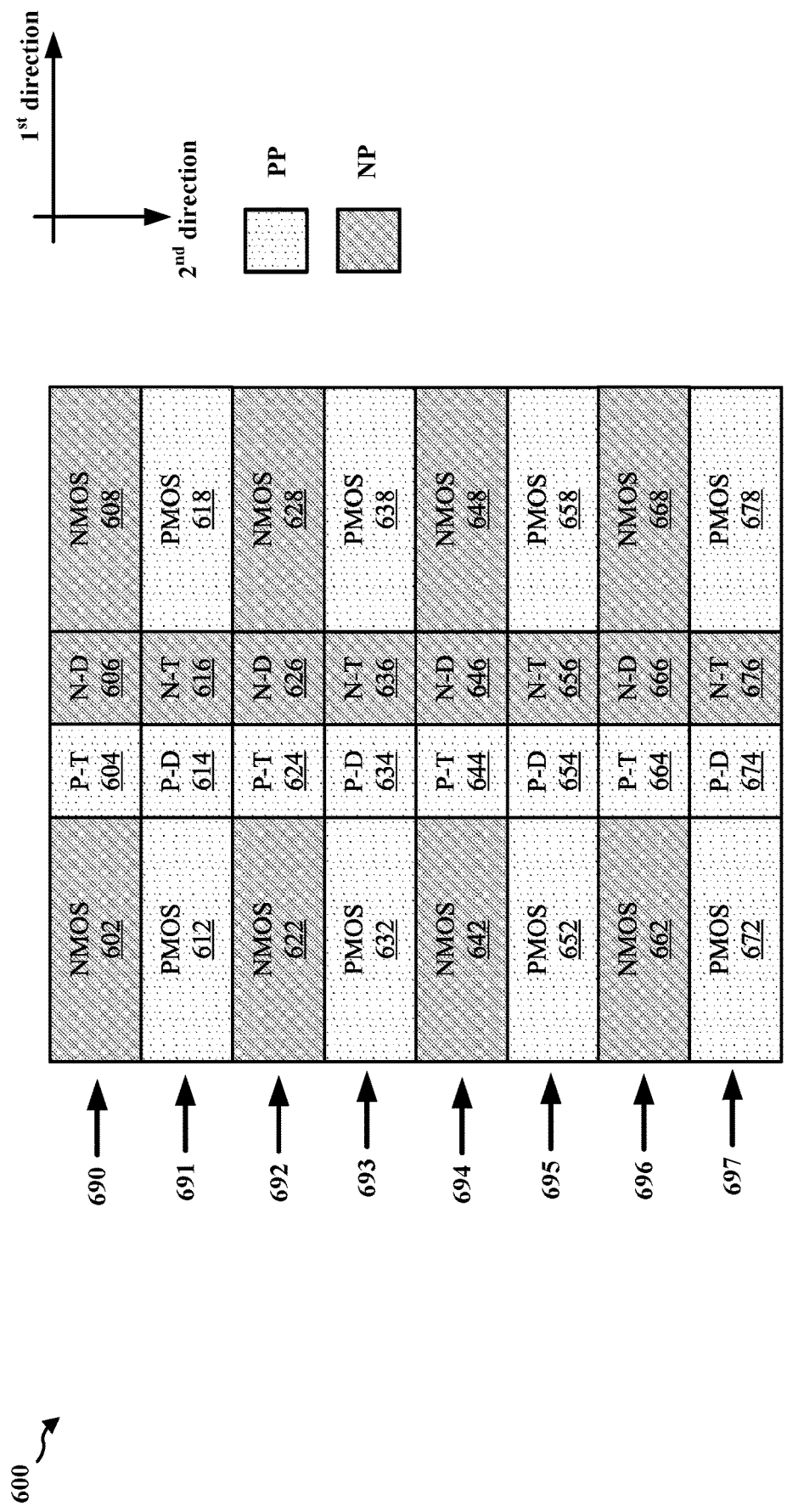
FIG. 6 is a first diagram conceptually illustrating a top-view of a first configuration of a dummy cell and tap cell layout structure.
Figure 7:
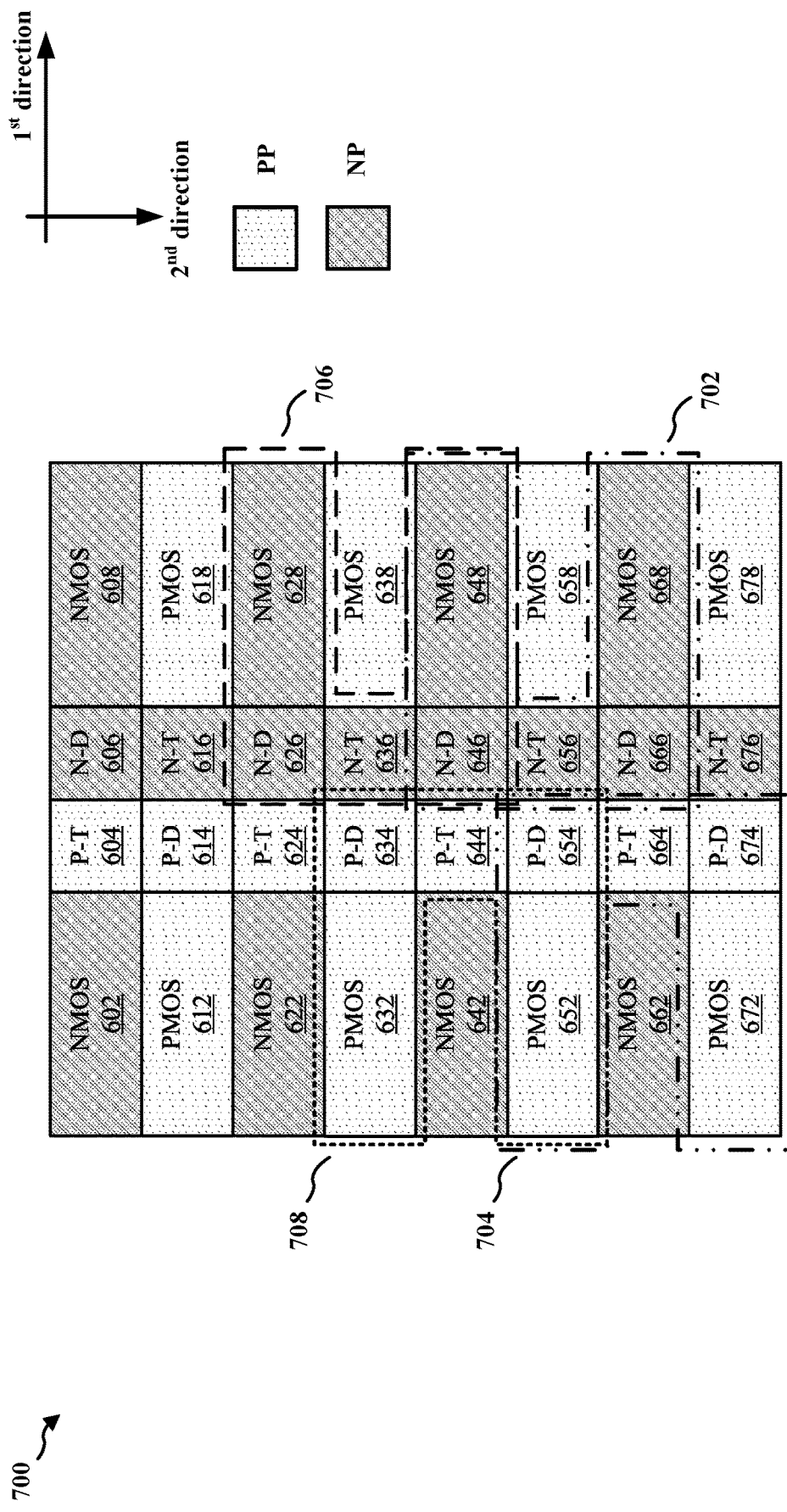
FIG. 7 is a second diagram conceptually illustrating a top-view of the first configuration of a dummy cell and tap cell layout structure.

FIG. 6 is a first diagram 600 conceptually illustrating a top-view of a first configuration of a dummy cell and tap cell layout structure. FIG. 7 is a second diagram 700 conceptually illustrating a top-view of the first configuration of a dummy cell and tap cell layout structure. The first and second diagrams 600, 700 illustrate a MOS IC. The MOS IC includes circuits 690-697. The circuit 690 includes a plurality of nMOS devices 602/608, a p-tap cell 604, and a dummy nMOS cell 606. The plurality of nMOS devices 602/608 is spaced apart in a first direction. The p-tap cell 604 and the dummy nMOS cell 606 are adjacent to each other in the first direction between the plurality of nMOS devices 602/608. The p-tap cell 604 is configured to be coupled to a first voltage source. The p-tap cell 604 provides a body connection for the plurality of nMOS devices 602/608. In one example, the first voltage source is configured to provide the voltage Vss.

The circuit 691 includes a plurality of pMOS devices 612/618, a dummy pMOS cell 614, and an n-tap cell 616. Assuming the IC is implemented with a p-type substrate, the circuit 691 is located within an n-well on the p-type substrate. The plurality of pMOS devices 612/618 is adjacent to the plurality of nMOS devices 602/608 in a second direction orthogonal to the first direction. The plurality of pMOS devices 612/618 is spaced apart in the first direction. The dummy pMOS cell 614 and the n-tap cell 616 are adjacent to each other in the first direction between the plurality of pMOS devices 612/618. The n-tap cell 616 is configured to be coupled to a second voltage source. The n-tap cell 616 provides a body connection for the plurality of pMOS devices 612/618. In one example, the second voltage source is configured to provide the voltage Vdd. The p-tap cell 604 and the dummy pMOS cell 614 are adjacent to each other in the second direction. The dummy nMOS cell 606 and the n-tap cell 616 are adjacent to each other in the second direction.

The circuit 692 includes a plurality of nMOS devices 622/628, a p-tap cell 624, and a dummy nMOS cell 626. The plurality of nMOS devices 622/628 is adjacent to the plurality of pMOS devices 612/618 in the second direction. The plurality of nMOS devices 622/628 is spaced apart in the first direction. The p-tap cell 624 and the dummy nMOS cell 626 are adjacent to each other in the first direction between the plurality of nMOS devices 622/628. The p-tap cell 624 is configured to be coupled to the first voltage source. The p-tap cell 624 provides a body connection for the plurality of nMOS devices 622/628. The dummy pMOS cell 614 and the p-tap cell 624 are adjacent to each other in the second direction. The n-tap cell 616 and the dummy nMOS cell 626 are adjacent to each other in the second direction.

The circuit 693 includes a plurality of pMOS devices 632/638, a dummy pMOS cell 634, and an n-tap cell 636. Assuming the IC is implemented with a p-type substrate, the circuit 693 is located within an n-well on the p-type substrate. The plurality of pMOS devices 632/638 is adjacent to the plurality of nMOS devices 622/628 in the second direction. The plurality of pMOS devices 632/638 is spaced apart in the first direction. The dummy pMOS cell 634 and the n-tap cell 636 are adjacent to each other in the first direction between the plurality of pMOS devices 632/638. The n-tap cell 636 is configured to be coupled to the second voltage source. The n-tap cell 636 provides a body connection for the plurality of pMOS devices 632/638. The p-tap cell 624 and the dummy pMOS cell 634 are adjacent to each other in the second direction. The dummy nMOS cell 626 and the n-tap cell 636 are adjacent to each other in the second direction.

The circuit 694 includes a plurality of nMOS devices 642/648, a p-tap cell 644, and a dummy nMOS cell 646. The plurality of nMOS devices 642/648 is adjacent to the plurality of pMOS devices 632/638 in the second direction. The plurality of nMOS devices 642/648 is spaced apart in the first direction. The p-tap cell 644 and the dummy nMOS cell 646 are adjacent to each other in the first direction between the plurality of nMOS devices 642/648. The p-tap cell 644 is configured to be coupled to the first voltage source. The p-tap cell 644 provides a body connection for the plurality of nMOS devices 642/648. The dummy pMOS cell 634 and the p-tap cell 644 are adjacent to each other in the second direction. The n-tap cell 636 and the dummy nMOS cell 646 are adjacent to each other in the second direction.

The circuit 695 includes a plurality of pMOS devices 652/658, a dummy pMOS cell 654, and an n-tap cell 656. Assuming the IC is implemented with a p-type substrate, the circuit 695 is located within an n-well on the p-type substrate. The plurality of pMOS devices 652/658 is adjacent to the plurality of nMOS devices 642/648 in the second direction. The plurality of pMOS devices 652/658 is spaced apart in the first direction. The dummy pMOS cell 654 and the n-tap cell 656 are adjacent to each other in the first direction between the plurality of pMOS devices 652/658. The n-tap cell 656 is configured to be coupled to the second voltage source. The n-tap cell 656 provides a body connection for the plurality of pMOS devices 652/658. The p-tap cell 644 and the dummy pMOS cell 654 are adjacent to each other in the second direction. The dummy nMOS cell 646 and the n-tap cell 656 are adjacent to each other in the second direction.

The circuit 696 includes a plurality of nMOS devices 662/668, a p-tap cell 664, and a dummy nMOS cell 666. The plurality of nMOS devices 662/668 is adjacent to the plurality of pMOS devices 652/658 in the second direction. The plurality of nMOS devices 662/668 is spaced apart in the first direction. The p-tap cell 664 and the dummy nMOS cell 666 are adjacent to each other in the first direction between the plurality of nMOS devices 662/668. The p-tap cell 664 is configured to be coupled to the first voltage source. The p-tap cell 664 provides a body connection for the plurality of nMOS devices 662/668. The dummy pMOS cell 654 and the p-tap cell 664 are adjacent to each other in the second direction. The n-tap cell 656 and the dummy nMOS cell 666 are adjacent to each other in the second direction.

The circuit 697 includes a plurality of pMOS devices 672/678, a dummy pMOS cell 674, and an n-tap cell 676. Assuming the IC is implemented with a p-type substrate, the circuit 697 is located within an n-well on the p-type substrate. The plurality of pMOS devices 672/678 is adjacent to the plurality of nMOS devices 662/668 in the second direction. The plurality of pMOS devices 672/678 is spaced apart in the first direction. The dummy pMOS cell 674 and the n-tap cell 676 are adjacent to each other in the first direction between the plurality of pMOS devices 672/678. The n-tap cell 676 is configured to be coupled to the second voltage source. The n-tap cell 676 provides a body connection for the plurality of pMOS devices 672/678. The p-tap cell 664 and the dummy pMOS cell 674 are adjacent to each other in the second direction. The dummy nMOS cell 666 and the n-tap cell 676 are adjacent to each other in the second direction.

The dummy nMOS cells 606, 626, 646, 666 may be configured to be floating, coupled to the first voltage source, or coupled to the second voltage source. Likewise, the dummy pMOS cells 614, 634, 654, 674 may be configured to be floating, coupled to the first voltage source, or coupled to the second voltage source. The second voltage source, for example Vdd, may be configured to provide a higher voltage than the first voltage source, for example Vss. As can be appreciated in FIG. 6, an area of each of the p-tap cells 604, 624, 644, 664; the dummy nMOS cells 606, 626, 646, 666; the dummy pMOS cells 614, 634, 654, 674; and the n-tap cells 616, 636, 656, 676 is approximately equal. OD regions (shown in FIG. 4 by the inner rectangle within each device/cell; may also be referred to as OD islands in this case) of the p-tap cells 604, 624, 644, 664; the dummy nMOS cells 606, 626, 646, 666; the dummy pMOS cells 614, 634, 654, 674; and the n-tap cells 616, 636, 656, 676 are separate and discontinuous with respect to each other.

Referring to FIG. 7, the NP layers of the nMOS devices, dummy nMOS cells, and n-tap cells form C-shapes 702, 706 around PP layers of pMOS devices, and the PP layers of the pMOS devices, dummy pMOS cells, and p-tap cells form C-shapes 704, 708 around NP layers of nMOS devices. The dummy cell and tap cell layout structure excludes corner case abutment of four-corner areas of adjoining NP, PP, NP, PP layers, and consequently, avoids DRC violations in association with such corner case abutment.

The dummy cell and tap cell layout structure discussed in relation to FIGS. 6, 7, include dummy nMOS/pMOS cells that change the configuration of the NP/PP layers in order to exclude corner case abutment of NP, PP, NP, PP four-corner areas. The addition of the dummy nMOS/pMOS cells increases an overall area of the IC. Several alternative configurations of the dummy cell and tap cell layout structure that may reduce the amount of area utilized by the dummy cells are provided below with respect to FIGS. 8, 9, 10.

Figure 8:
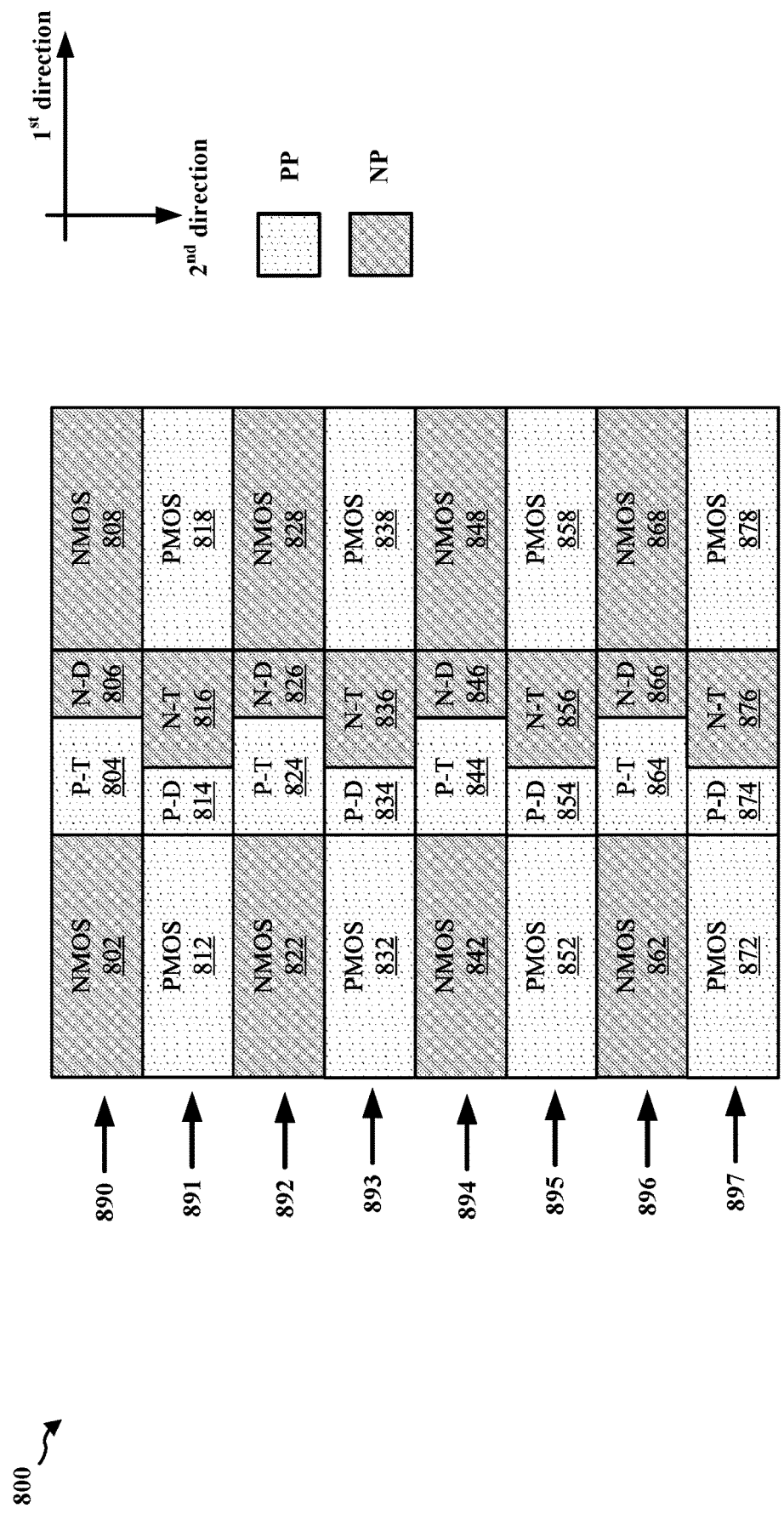
FIG. 8 is a diagram conceptually illustrating a top-view of a second configuration of a dummy cell and tap cell layout structure.

FIG. 8 is a diagram 800 conceptually illustrating a top-view of a second configuration of a dummy cell and tap cell layout structure. In FIG. 8, the dummy nMOS/pMOS cells are reduced in width and the adjacent p-tap cells and n-tap cells are enlarged in width by the same amount as the reduction in width of the dummy nMOS/pMOS cells. Providing a larger OD area for the tap cell body connections may provide some performance improvements in some configurations. The diagram 800 illustrates a MOS IC. The MOS IC includes circuits 890-897. The circuit 890 includes a plurality of nMOS devices 802/808, a p-tap cell 804, and a dummy nMOS cell 806. The plurality of nMOS devices 802/808 is spaced apart in a first direction. The p-tap cell 804 and the dummy nMOS cell 806 are adjacent to each other in the first direction between the plurality of nMOS devices 802/808. The p-tap cell 804 is configured to be coupled to a first voltage source. The p-tap cell 804 provides a body connection for the plurality of nMOS devices 802/808. In one example, the first voltage source is configured to provide the voltage Vss.

The circuit 891 includes a plurality of pMOS devices 812/818, a dummy pMOS cell 814, and an n-tap cell 816. Assuming the IC is implemented with a p-type substrate, the circuit 891 is located within an n-well on the p-type substrate. The plurality of pMOS devices 812/818 is adjacent to the plurality of nMOS devices 802/808 in a second direction orthogonal to the first direction. The plurality of pMOS devices 812/818 is spaced apart in the first direction. The dummy pMOS cell 814 and the n-tap cell 816 are adjacent to each other in the first direction between the plurality of pMOS devices 812/818. The n-tap cell 816 is configured to be coupled to a second voltage source. The n-tap cell 816 provides a body connection for the plurality of pMOS devices 812/818. In one example, the second voltage source is configured to provide the voltage Vdd. In this configuration, the p-tap cell 804 is adjacent to both the dummy pMOS cell 814 and the n-tap cell 816 in the second direction. In addition, the n-tap cell 816 is adjacent to both the p-tap cell 804 and the dummy nMOS cell 806 in the second direction. Further, the nMOS devices 802/808 are non-adjacent in the second direction to the dummy pMOS cell 814 and the n-tap cell 816, and the pMOS devices 812/818 are non-adjacent in the second direction to the p-tap cell 804 and the dummy nMOS cell 806.

The circuit 892 includes a plurality of nMOS devices 822/828, a p-tap cell 824, and a dummy nMOS cell 826. The plurality of nMOS devices 822/828 is adjacent to the plurality of pMOS devices 812/818 in the second direction. The plurality of nMOS devices 822/828 is spaced apart in the first direction. The p-tap cell 824 and the dummy nMOS cell 826 are adjacent to each other in the first direction between the plurality of nMOS devices 822/828. The p-tap cell 824 is configured to be coupled to the first voltage source. The p-tap cell 824 provides a body connection for the plurality of nMOS devices 822/828. In this configuration, the n-tap cell 816 is adjacent to both the p-tap cell 824 and the dummy nMOS cell 826 in the second direction. In addition, the p-tap cell 824 is adjacent to both the dummy pMOS cell 814 and the n-tap cell 816 in the second direction. Further, the pMOS devices 812/818 are non-adjacent in the second direction to the p-tap cell 824 and the dummy nMOS cell 826, and the nMOS devices 822/828 are non-adjacent in the second direction to the dummy pMOS cell 814 and the n-tap cell 816.

The circuit 893 includes a plurality of pMOS devices 832/838, a dummy pMOS cell 834, and an n-tap cell 836. Assuming the IC is implemented with a p-type substrate, the circuit 893 is located within an n-well on the p-type substrate. The plurality of pMOS devices 832/838 is adjacent to the plurality of nMOS devices 822/828 in the second direction. The plurality of pMOS devices 832/838 is spaced apart in the first direction. The dummy pMOS cell 834 and the n-tap cell 836 are adjacent to each other in the first direction between the plurality of pMOS devices 832/838. The n-tap cell 836 is configured to be coupled to the second voltage source. The n-tap cell 836 provides a body connection for the plurality of pMOS devices 832/838. In this configuration, the p-tap cell 824 is adjacent to both the dummy pMOS cell 834 and the n-tap cell 836 in the second direction. In addition, the n-tap cell 836 is adjacent to both the p-tap cell 824 and the dummy nMOS cell 826 in the second direction. Further, the nMOS devices 822/828 are non-adjacent in the second direction to the dummy pMOS cell 834 and the n-tap cell 836, and the pMOS devices 832/838 are non-adjacent in the second direction to the p-tap cell 824 and the dummy nMOS cell 826.

The circuit 894 includes a plurality of nMOS devices 842/848, a p-tap cell 844, and a dummy nMOS cell 846. The plurality of nMOS devices 842/848 is adjacent to the plurality of pMOS devices 832/838 in the second direction. The plurality of nMOS devices 842/848 is spaced apart in the first direction. The p-tap cell 844 and the dummy nMOS cell 846 are adjacent to each other in the first direction between the plurality of nMOS devices 842/848. The p-tap cell 844 is configured to be coupled to the first voltage source. The p-tap cell 844 provides a body connection for the plurality of nMOS devices 842/848. In this configuration, the n-tap cell 836 is adjacent to both the p-tap cell 844 and the dummy nMOS cell 846 in the second direction. In addition, the p-tap cell 844 is adjacent to both the dummy pMOS cell 834 and the n-tap cell 836 in the second direction. Further, the pMOS devices 832/838 are non-adjacent in the second direction to the p-tap cell 844 and the dummy nMOS cell 846, and the nMOS devices 842/848 are non-adjacent in the second direction to the dummy pMOS cell 834 and the n-tap cell 836.

The circuit 895 includes a plurality of pMOS devices 852/858, a dummy pMOS cell 854, and an n-tap cell 856.

Assuming the IC is implemented with a p-type substrate, the circuit 895 is located within an n-well on the p-type substrate. The plurality of pMOS devices 852/858 is adjacent to the plurality of nMOS devices 842/848 in the second direction. The plurality of pMOS devices 852/858 is spaced apart in the first direction. The dummy pMOS cell 854 and the n-tap cell 856 are adjacent to each other in the first direction between the plurality of pMOS devices 852/858. The n-tap cell 856 is configured to be coupled to the second voltage source. The n-tap cell 856 provides a body connection for the plurality of pMOS devices 852/858. In this configuration, the p-tap cell 844 is adjacent to both the dummy pMOS cell 854 and the n-tap cell 856 in the second direction. In addition, the n-tap cell 856 is adjacent to both the p-tap cell 844 and the dummy nMOS cell 846 in the second direction. Further, the nMOS devices 842/848 are non-adjacent in the second direction to the dummy pMOS cell 854 and the n-tap cell 856, and the pMOS devices 852/858 are non-adjacent in the second direction to the p-tap cell 844 and the dummy nMOS cell 846.

The circuit 896 includes a plurality of nMOS devices 862/868, a p-tap cell 864, and a dummy nMOS cell 866. The plurality of nMOS devices 862/868 is adjacent to the plurality of pMOS devices 852/858 in the second direction. The plurality of nMOS devices 862/868 is spaced apart in the first direction. The p-tap cell 864 and the dummy nMOS cell 866 are adjacent to each other in the first direction between the plurality of nMOS devices 862/868. The p-tap cell 864 is configured to be coupled to the first voltage source. The p-tap cell 864 provides a body connection for the plurality of nMOS devices 862/868. In this configuration, the n-tap cell 856 is adjacent to both the p-tap cell 864 and the dummy nMOS cell 866 in the second direction. In addition, the p-tap cell 864 is adjacent to both the dummy pMOS cell 854 and the n-tap cell 856 in the second direction. Further, the pMOS devices 852/858 are non-adjacent in the second direction to the p-tap cell 864 and the dummy nMOS cell 866, and the nMOS devices 862/868 are non-adjacent in the second direction to the dummy pMOS cell 854 and the n-tap cell 856.

The circuit 897 includes a plurality of pMOS devices 872/878, a dummy pMOS cell 874, and an n-tap cell 876. Assuming the IC is implemented with a p-type substrate, the circuit 897 is located within an n-well on the p-type substrate. The plurality of pMOS devices 872/878 is adjacent to the plurality of nMOS devices 862/868 in the second direction. The plurality of pMOS devices 872/878 is spaced apart in the first direction. The dummy pMOS cell 874 and the n-tap cell 876 are adjacent to each other in the first direction between the plurality of pMOS devices 872/878. The n-tap cell 876 is configured to be coupled to the second voltage source. The n-tap cell 876 provides a body connection for the plurality of pMOS devices 872/878. In this configuration, the p-tap cell 864 is adjacent to both the dummy pMOS cell 874 and the n-tap cell 876 in the second direction. In addition, the n-tap cell 876 is adjacent to both the p-tap cell 864 and the dummy nMOS cell 866 in the second direction. Further, the nMOS devices 862/868 are non-adjacent in the second direction to the dummy pMOS cell 874 and the n-tap cell 876, and the pMOS devices 872/878 are non-adjacent in the second direction to the p-tap cell 864 and the dummy nMOS cell 866.

The dummy nMOS cells 806, 826, 846, 866 may be configured to be floating, coupled to the first voltage source, or coupled to the second voltage source. Likewise, the dummy pMOS cells 814, 834, 854, 874 may be configured to be floating, coupled to the first voltage source, or coupled to the second voltage source. The second voltage source, for example Vdd, may be configured to provide a higher voltage than the first voltage source, for example Vss. As can be appreciated in FIG. 8, an area of each of the p-tap cells 804, 824, 844, 864 is greater than an area of each of the dummy nMOS cells 806, 826, 846, 866. In addition, an area of each of the n-tap cells 816, 836, 856, 876 is greater than an area of each of the dummy pMOS cells 814, 834, 854, 874. OD regions (shown in FIG. 4 by the inner rectangle within each device/cell; may also be referred to as OD islands in this case) of the p-tap cells 804, 824, 844, 864; the dummy nMOS cells 806, 826, 846, 866; the dummy pMOS cells 814, 834, 854, 874; and the n-tap cells 816, 836, 856, 876 are separate and discontinuous with respect to each other.

The dummy cell and tap cell layout structure discussed in relation to FIG. 8, includes dummy nMOS/pMOS cells that change the configuration of the NP/PP layers in order to exclude corner case abutment of NP, PP, NP, PP four-corner areas. The addition of the dummy nMOS/pMOS cells increases an overall area of the IC. However, the area utilized by the dummy nMOS/pMOS cells is reduced by reducing a width of the dummy nMOS/pMOS cells as compared the dummy nMOS/pMOS cells in the layout structure discussed in relation to FIG. 6. Further, the n-tap cells are enlarged by the same width reduced from the dummy nMOS/pMOS cells, providing a larger OD area for the nMOS/pMOS device body connections, which may provide some performance improvements in some configurations.

Figure 9:
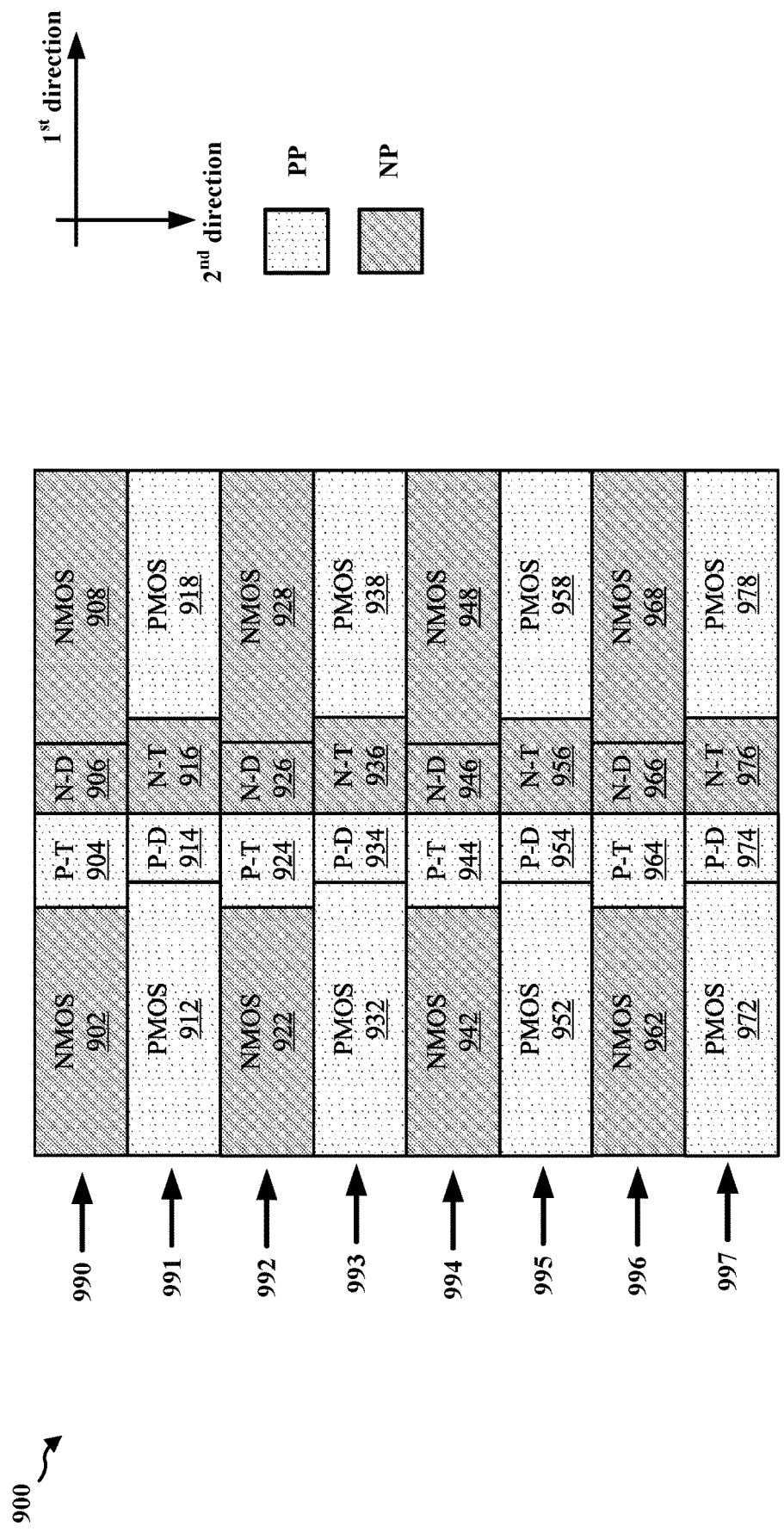
FIG. 9 is a diagram conceptually illustrating a top-view of a third configuration of a dummy cell and tap cell layout structure.

FIG. 9 is a diagram 900 conceptually illustrating a top-view of a third configuration of a dummy cell and tap cell layout structure. In FIG. 9, the dummy nMOS/pMOS cells are reduced in width and the adjacent nMOS/pMOS devices are enlarged in width by the same amount as the reduction in width of the dummy nMOS/pMOS cells. Providing a larger OD area for the active nMOS/pMOS devices may provide some performance improvements in some configurations. The diagram 900 illustrates a MOS IC. The MOS IC includes circuits 990-997. The circuit 990 includes a plurality of nMOS devices 902/908, a p-tap cell 904, and a dummy nMOS cell 906. The plurality of nMOS devices 902/908 is spaced apart in a first direction. The p-tap cell 904 and the dummy nMOS cell 906 are adjacent to each other in the first direction between the plurality of nMOS devices 902/908. The p-tap cell 904 is configured to be coupled to a first voltage source. The p-tap cell 904 provides a body connection for the plurality of nMOS devices 902/908. In one example, the first voltage source is configured to provide the voltage Vss.

The circuit 991 includes a plurality of pMOS devices 912/918, a dummy pMOS cell 914, and an n-tap cell 916. Assuming the IC is implemented with a p-type substrate, the circuit 991 is located within an n-well on the p-type substrate. The plurality of pMOS devices 912/918 is adjacent to the plurality of nMOS devices 902/908 in a second direction orthogonal to the first direction. The plurality of pMOS devices 912/918 is spaced apart in the first direction. The dummy pMOS cell 914 and the n-tap cell 916 are adjacent to each other in the first direction between the plurality of pMOS devices 912/918. The n-tap cell 916 is configured to be coupled to a second voltage source. The n-tap cell 916 provides a body connection for the plurality of pMOS devices 912/918. In one example, the second voltage source is configured to provide the voltage Vdd. In this configuration, the p-tap cell 904 is adjacent in the second direction to both the dummy pMOS cell 914 and the pMOS device 912.

In addition, the n-tap cell 916 is adjacent in the second direction to both the dummy nMOS cell 906 and the nMOS device 908.

The circuit 992 includes a plurality of nMOS devices 922/928, a p-tap cell 924, and a dummy nMOS cell 926. The plurality of nMOS devices 922/928 is adjacent to the plurality of pMOS devices 912/918 in the second direction. The plurality of nMOS devices 922/928 is spaced apart in the first direction. The p-tap cell 924 and the dummy nMOS cell 926 are adjacent to each other in the first direction between the plurality of nMOS devices 922/928. The p-tap cell 924 is configured to be coupled to the first voltage source. The p-tap cell 924 provides a body connection for the plurality of nMOS devices 922/928. In this configuration, the n-tap cell 916 is adjacent in the second direction to both the dummy nMOS cell 926 and the nMOS device 928. In addition, the p-tap cell 924 is adjacent in the second direction to both the dummy pMOS cell 914 and the pMOS device 912.

The circuit 993 includes a plurality of pMOS devices 932/938, a dummy pMOS cell 934, and an n-tap cell 936. Assuming the IC is implemented with a p-type substrate, the circuit 993 is located within an n-well on the p-type substrate. The plurality of pMOS devices 932/938 is adjacent to the plurality of nMOS devices 922/928 in the second direction. The plurality of pMOS devices 932/938 is spaced apart in the first direction. The dummy pMOS cell 934 and the n-tap cell 936 are adjacent to each other in the first direction between the plurality of pMOS devices 932/938. The n-tap cell 936 is configured to be coupled to the second voltage source. The n-tap cell 936 provides a body connection for the plurality of pMOS devices 932/938. In this configuration, the p-tap cell 924 is adjacent in the second direction to both the dummy pMOS cell 934 and the pMOS device 932. In addition, the n-tap cell 936 is adjacent in the second direction to both the dummy nMOS cell 926 and the nMOS device 928.

The circuit 994 includes a plurality of nMOS devices 942/948, a p-tap cell 944, and a dummy nMOS cell 946. The plurality of nMOS devices 942/948 is adjacent to the plurality of pMOS devices 932/938 in the second direction. The plurality of nMOS devices 942/948 is spaced apart in the first direction. The p-tap cell 944 and the dummy nMOS cell 946 are adjacent to each other in the first direction between the plurality of nMOS devices 942/948. The p-tap cell 944 is configured to be coupled to the first voltage source. The p-tap cell 944 provides a body connection for the plurality of nMOS devices 942/948. In this configuration, the n-tap cell 936 is adjacent in the second direction to both the dummy nMOS cell 946 and the nMOS device 948. In addition, the p-tap cell 944 is adjacent in the second direction to both the dummy pMOS cell 934 and the pMOS device 932.

The circuit 995 includes a plurality of pMOS devices 952/958, a dummy pMOS cell 954, and an n-tap cell 956. Assuming the IC is implemented with a p-type substrate, the circuit 995 is located within an n-well on the p-type substrate. The plurality of pMOS devices 952/958 is adjacent to the plurality of nMOS devices 942/948 in the second direction. The plurality of pMOS devices 952/958 is spaced apart in the first direction. The dummy pMOS cell 954 and the n-tap cell 956 are adjacent to each other in the first direction between the plurality of pMOS devices 952/958. The n-tap cell 956 is configured to be coupled to the second voltage source. The n-tap cell 956 provides a body connection for the plurality of pMOS devices 952/958. In this configuration, the p-tap cell 944 is adjacent in the second direction to both the dummy pMOS cell 954 and the pMOS device 952. In addition, the n-tap cell 956 is adjacent in the second direction to both the dummy nMOS cell 946 and the nMOS device 948.

The circuit 996 includes a plurality of nMOS devices 962/968, a p-tap cell 964, and a dummy nMOS cell 966. The plurality of nMOS devices 962/968 is adjacent to the plurality of pMOS devices 952/958 in the second direction. The plurality of nMOS devices 962/968 is spaced apart in the first direction. The p-tap cell 964 and the dummy nMOS cell 966 are adjacent to each other in the first direction between the plurality of nMOS devices 962/968. The p-tap cell 964 is configured to be coupled to the first voltage source. The p-tap cell 964 provides a body connection for the plurality of nMOS devices 962/968. In this configuration, the n-tap cell 956 is adjacent in the second direction to both the dummy nMOS cell 966 and the nMOS device 968. In addition, the p-tap cell 964 is adjacent in the second direction to both the dummy pMOS cell 954 and the pMOS device 952.

The circuit 997 includes a plurality of pMOS devices 972/978, a dummy pMOS cell 974, and an n-tap cell 976. Assuming the IC is implemented with a p-type substrate, the circuit 997 is located within an n-well on the p-type substrate. The plurality of pMOS devices 972/978 is adjacent to the plurality of nMOS devices 962/968 in the second direction. The plurality of pMOS devices 972/978 is spaced apart in the first direction. The dummy pMOS cell 974 and the n-tap cell 976 are adjacent to each other in the first direction between the plurality of pMOS devices 972/978. The n-tap cell 976 is configured to be coupled to the second voltage source. The n-tap cell 976 provides a body connection for the plurality of pMOS devices 972/978. In this configuration, the p-tap cell 964 is adjacent in the second direction to both the dummy pMOS cell 974 and the pMOS device 972. In addition, the n-tap cell 976 is adjacent in the second direction to both the dummy nMOS cell 966 and the nMOS device 968.

The dummy nMOS cells 906, 926, 946, 966 may be configured to be floating, coupled to the first voltage source, or coupled to the second voltage source. Likewise, the dummy pMOS cells 914, 934, 954, 974 may be configured to be floating, coupled to the first voltage source, or coupled to the second voltage source. The second voltage source, for example Vdd, may be configured to provide a higher voltage than the first voltage source, for example Vss. As can be appreciated in FIG. 9, an area of each of the p-tap cells 904, 924, 944, 964 is greater than an area of each of the dummy nMOS cells 906, 926, 946, 966. In addition, an area of each of the n-tap cells 916, 936, 956, 976 is greater than an area of each of the dummy pMOS cells 914, 934, 954, 974. OD regions (shown in FIG. 4 by the inner rectangle within each device/cell; may also be referred to as OD islands in this case) of the p-tap cells 904, 924, 944, 964; the dummy nMOS cells 906, 926, 946, 966; the dummy pMOS cells 914, 934, 954, 974; and the n-tap cells 916, 936, 956, 976 are separate and discontinuous with respect to each other.

The dummy cell and tap cell layout structure discussed in relation to FIG. 9, includes dummy nMOS/pMOS cells that change the configuration of the NP/PP layers in order to exclude corner case abutment of NP, PP, NP, PP four-corner areas. The addition of the dummy nMOS/pMOS cells increases an overall area of the IC. However, the area utilized by the dummy nMOS/pMOS cells is reduced by reducing a width of the dummy nMOS/pMOS cells as compared the dummy nMOS/pMOS cells in the layout structure discussed in relation to FIG. 6. Further, the adjacent nMOS/pMOS devices are enlarged by the same width reduced from the dummy nMOS/pMOS cells, providing a larger OD area for the nMOS/pMOS devices, which may provide some performance improvements in some configurations.

The dummy cell and layout structure discussed in relation to FIGS. 8, 9, avoids the corner case abutment of NP, PP, NP, PP four-corner areas, but the implant is unbalanced, as evidenced by the $2^{nd}$ and $3^{rd}$ columns of dummy/tap cells having a jagged boundary of the NP/PP layers. Having an unbalanced implant may potentially cause manufacturing yield issues. An alternative configuration is provided with respect to FIG. 10 that provides a balanced implant while also avoiding the corner case abutment of NP, PP, NP, PP four-corner areas.

Figure 10:
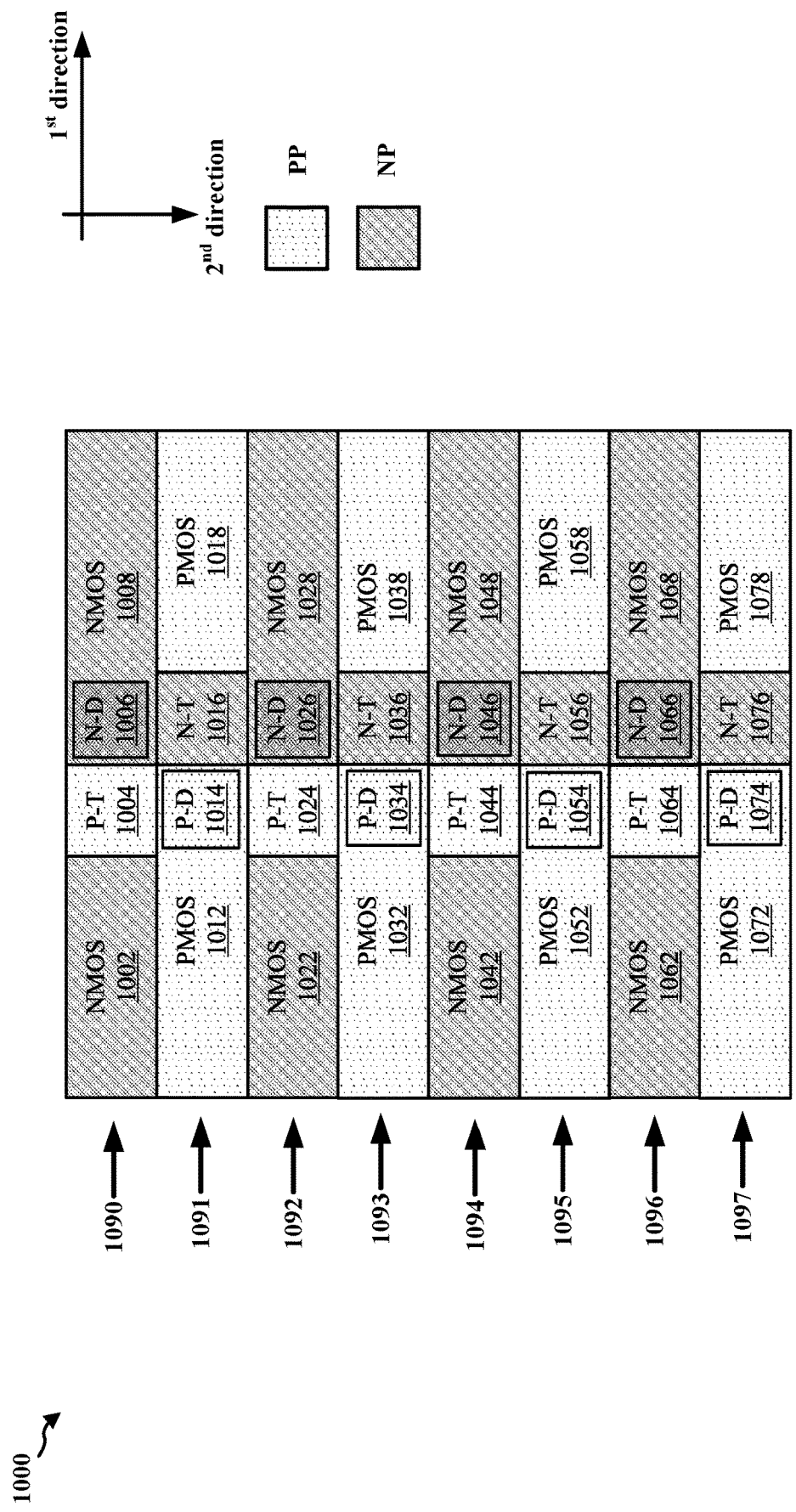
FIG. 10 is a diagram conceptually illustrating a top-view of a fourth configuration of a dummy cell and tap cell layout structure.

FIG. 10 is a diagram 1000 conceptually illustrating a top-view of a fourth configuration of a dummy cell and tap cell layout structure. In FIG. 10, the dummy nMOS cells have a continuous OD region with adjacent nMOS devices, and the dummy pMOS cells have a continuous OD region with adjacent pMOS devices. Providing for a continuous OD region of the active devices and dummy nMOS/pMOS cells may also provide some performance improvements in some configurations, as the active devices may have more OD area to utilize for performing the designed functions without taking up space for diffusion breaks. The MOS IC includes circuits 1090-1097. The circuit 1090 includes a plurality of nMOS devices 1002/1008, a p-tap cell 1004, and a dummy nMOS cell 1006. The plurality of nMOS devices 1002/1008 is spaced apart in a first direction. The p-tap cell 1004 and the dummy nMOS cell 1006 are adjacent to each other in the first direction between the plurality of nMOS devices 1002/1008. The p-tap cell 1004 is configured to be coupled to a first voltage source. The p-tap cell 1004 provides a body connection for the plurality of nMOS devices 1002/1008. In one example, the first voltage source is configured to provide the voltage Vss. The nMOS device 1008 and the dummy nMOS cell 1006 have a continuous OD region in the first direction.

The circuit 1091 includes a plurality of pMOS devices 1012/1018, a dummy pMOS cell 1014, and an n-tap cell 1016. Assuming the IC is implemented with a p-type substrate, the circuit 1091 is located within an n-well on the p-type substrate. The plurality of pMOS devices 1012/1018 is adjacent to the plurality of nMOS devices 1002/1008 in a second direction orthogonal to the first direction. The plurality of pMOS devices 1012/1018 is spaced apart in the first direction. The dummy pMOS cell 1014 and the n-tap cell 1016 are adjacent to each other in the first direction between the plurality of pMOS devices 1012/1018. The n-tap cell 1016 is configured to be coupled to a second voltage source. The n-tap cell 1016 provides a body connection for the plurality of pMOS devices 1012/1018. In one example, the second voltage source is configured to provide the voltage Vdd. The p-tap cell 1004 and the dummy pMOS cell 1014 are adjacent to each other in the second direction. The dummy nMOS cell 1006 and the n-tap cell 1016 are adjacent to each other in the second direction. The pMOS device 1012 and the dummy pMOS cell 1014 have a continuous OD region in the first direction.

The circuit 1092 includes a plurality of nMOS devices 1022/1028, a p-tap cell 1024, and a dummy nMOS cell 1026. The plurality of nMOS devices 1022/1028 is adjacent to the plurality of pMOS devices 1012/1018 in the second direction. The plurality of nMOS devices 1022/1028 is spaced apart in the first direction. The p-tap cell 1024 and the dummy nMOS cell 1026 are adjacent to each other in the first direction between the plurality of nMOS devices 1022/1028. The p-tap cell 1024 is configured to be coupled to the first voltage source. The p-tap cell 1024 provides a body connection for the plurality of nMOS devices 1022/1028. The dummy pMOS cell 1014 and the p-tap cell 1024 are adjacent to each other in the second direction. The n-tap cell 1016 and the dummy nMOS cell 1026 are adjacent to each other in the second direction. The nMOS device 1028 and the dummy nMOS cell 1026 have a continuous OD region in the first direction.

The circuit 1093 includes a plurality of pMOS devices 1032/1038, a dummy pMOS cell 1034, and an n-tap cell 1036. Assuming the IC is implemented with a p-type substrate, the circuit 1093 is located within an n-well on the p-type substrate. The plurality of pMOS devices 1032/1038 is adjacent to the plurality of nMOS devices 1022/1028 in the second direction. The plurality of pMOS devices 1032/1038 is spaced apart in the first direction. The dummy pMOS cell 1034 and the n-tap cell 1036 are adjacent to each other in the first direction between the plurality of pMOS devices 1032/1038. The n-tap cell 1036 is configured to be coupled to the second voltage source. The n-tap cell 1036 provides a body connection for the plurality of pMOS devices 1032/1038. The p-tap cell 1024 and the dummy pMOS cell 1034 are adjacent to each other in the second direction. The dummy nMOS cell 1026 and the n-tap cell 1036 are adjacent to each other in the second direction. The pMOS device 1032 and the dummy pMOS cell 1034 have a continuous OD region in the first direction.

The circuit 1094 includes a plurality of nMOS devices 1042/1048, a p-tap cell 1044, and a dummy nMOS cell 1046. The plurality of nMOS devices 1042/1048 is adjacent to the plurality of pMOS devices 1032/1038 in the second direction. The plurality of nMOS devices 1042/1048 is spaced apart in the first direction. The p-tap cell 1044 and the dummy nMOS cell 1046 are adjacent to each other in the first direction between the plurality of nMOS devices 1042/1048. The p-tap cell 1044 is configured to be coupled to the first voltage source. The p-tap cell 1044 provides a body connection for the plurality of nMOS devices 1042/1048. The dummy pMOS cell 1034 and the p-tap cell 1044 are adjacent to each other in the second direction. The n-tap cell 1036 and the dummy nMOS cell 1046 are adjacent to each other in the second direction. The nMOS device 1048 and the dummy nMOS cell 1046 have a continuous OD region in the first direction.

The circuit 1095 includes a plurality of pMOS devices 1052/1058, a dummy pMOS cell 1054, and an n-tap cell 1056. Assuming the IC is implemented with a p-type substrate, the circuit 1095 is located within an n-well on the p-type substrate. The plurality of pMOS devices 1052/1058 is adjacent to the plurality of nMOS devices 1042/1048 in the second direction. The plurality of pMOS devices 1052/1058 is spaced apart in the first direction. The dummy pMOS cell 1054 and the n-tap cell 1056 are adjacent to each other in the first direction between the plurality of pMOS devices 1052/1058. The n-tap cell 1056 is configured to be coupled to the second voltage source. The n-tap cell 1056 provides a body connection for the plurality of pMOS devices 1052/1058. The p-tap cell 1044 and the dummy pMOS cell 1054 are adjacent to each other in the second direction. The dummy nMOS cell 1046 and the n-tap cell 1056 are adjacent to each other in the second direction. The pMOS device 1052 and the dummy pMOS cell 1054 have a continuous OD region in the first direction.

The circuit 1096 includes a plurality of nMOS devices 1062/1068, a p-tap cell 1064, and a dummy nMOS cell

1066. The plurality of nMOS devices 1062/1068 is adjacent to the plurality of pMOS devices 1052/1058 in the second direction. The plurality of nMOS devices 1062/1068 is spaced apart in the first direction. The p-tap cell 1064 and the dummy nMOS cell 1066 are adjacent to each other in the first direction between the plurality of nMOS devices 1062/1068. The p-tap cell 1064 is configured to be coupled to the first voltage source. The p-tap cell 1064 provides a body connection for the plurality of nMOS devices 1062/1068. The dummy pMOS cell 1054 and the p-tap cell 1064 are adjacent to each other in the second direction. The n-tap cell 1056 and the dummy nMOS cell 1066 are adjacent to each other in the second direction. The nMOS device 1068 and the dummy nMOS cell 1066 have a continuous OD region in the first direction.

The circuit 1097 includes a plurality of pMOS devices 1072/1078, a dummy pMOS cell 1074, and an n-tap cell 1076. Assuming the IC is implemented with a p-type substrate, the circuit 1097 is located within an n-well on the p-type substrate. The plurality of pMOS devices 1072/1078 is adjacent to the plurality of nMOS devices 1062/1068 in the second direction. The plurality of pMOS devices 1072/1078 is spaced apart in the first direction. The dummy pMOS cell 1074 and the n-tap cell 1076 are adjacent to each other in the first direction between the plurality of pMOS devices 1072/1078. The n-tap cell 1076 is configured to be coupled to the second voltage source. The n-tap cell 1076 provides a body connection for the plurality of pMOS devices 1072/1078. The p-tap cell 1064 and the dummy pMOS cell 1074 are adjacent to each other in the second direction. The dummy nMOS cell 1066 and the n-tap cell 1076 are adjacent to each other in the second direction. The pMOS device 1072 and the dummy pMOS cell 1074 have a continuous OD region in the first direction.

The dummy nMOS cells 1006, 1026, 1046, 1066 may be configured to be floating, coupled to the first voltage source, or coupled to the second voltage source. Likewise, the dummy pMOS cells 1014, 1034, 1054, 1074 may be configured to be floating, coupled to the first voltage source, or coupled to the second voltage source. The second voltage source, for example Vdd, may be configured to provide a higher voltage than the first voltage source, for example Vss. OD regions for each dummy nMOS/pMOS cell in each circuit 1090-1097 is continuous with the OD region of the adjacent nMOS/pMOS device in the first direction. Accordingly, each dummy nMOS cell has a continuous OD region with the corresponding adjacent nMOS device, and each dummy pMOS cell has a continuous OD region with the corresponding adjacent pMOS device.

The dummy cell and tap cell layout structure discussed in relation to FIG. 10, includes dummy nMOS/pMOS cells that change the configuration of the NP/PP layers in order to exclude corner case abutment of NP, PP, NP, PP four-corner areas. The addition of the dummy nMOS/pMOS cells increases an overall area of the IC. However, the area utilized by the dummy nMOS/pMOS cells is reduced as compared to the dummy cell and tap cell layout structure in FIG. 6 through the use of continuous OD regions for the dummy cells and adjacent active devices. Accordingly, the dummy cell and tap cell layout structure of FIG. 10 may provide a larger OD area for the nMOS/pMOS devices due to the absence of diffusion breaks than that provided by FIG. 6, and the larger OD area for the nMOS/pMOS devices may provide some performance improvements in some configurations.

Figure 11:
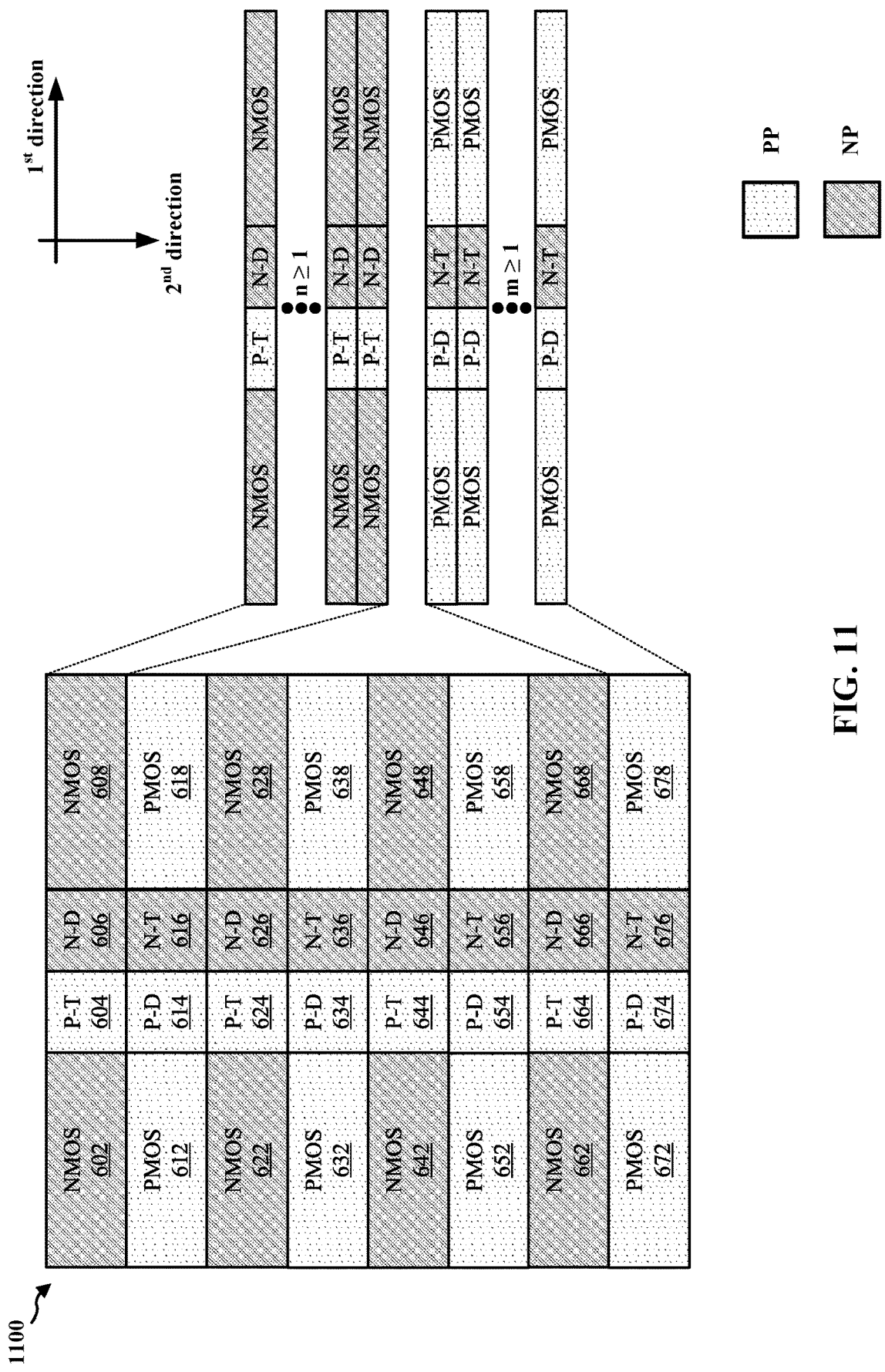
FIG. 11 is a third diagram conceptually illustrating a top-view of a dummy cell and tap cell layout structure.

FIG. 11 is a third diagram 1100 conceptually illustrating a top-view of a dummy cell and tap cell layout structure. Each of the plurality of nMOS devices in a circuit may include n rows of nMOS devices, where n≥1, and each of the plurality of pMOS devices in a circuit may include m rows of pMOS devices, where m≥1. In one example, m may be equal to n. In addition, each p-tap cell in a circuit may include n rows of p-tap cells, and each dummy nMOS cell may include n rows of dummy nMOS cells. Further, each dummy pMOS cell may include m rows of dummy pMOS cells, and each n-tap cell may include m rows of n-tap cells. Referring to FIGS. 4, 5, m=2 and n=2. Referring to FIGS. 6-10, each circuit of nMOS devices, p-tap cell, and dummy nMOS cell includes n rows, and each circuit of pMOS devices, n-tap cell, and dummy pMOS cell includes m rows. In one example, m is equal to n for FIGS. 6-10. However, m and n may be unequal in other configurations.

Referring again to FIGS. 6-11, a MOS IC includes a first circuit (694, 894, 994, 1094) including a first plurality of nMOS devices (642/648, 842/848, 942/948, 1042/1048), a first p-tap cell (644, 844, 944, 1044), and a first dummy nMOS cell (646, 846, 946, 1046). The first plurality of nMOS devices (642/648, 842/848, 942/948, 1042/1048) is spaced apart in a first direction. The first p-tap cell (644, 844, 944, 1044) and the first dummy nMOS cell (646, 846, 946, 1046) are adjacent to each other in the first direction between the first plurality of nMOS devices (642/648, 842/848, 942/948, 1042/1048). The first p-tap cell (644, 844, 944, 1044) is configured to be coupled to a first voltage source. The MOS IC further includes a second circuit (695, 895, 995, 1095) including a first plurality of pMOS devices (652/658, 852/858, 952/958, 1052/1058), a first dummy pMOS cell (654, 854, 954, 1054), and a first n-tap cell (656, 856, 956, 1056). The first plurality of pMOS devices (652/658, 852/858, 952/958, 1052/1058) is adjacent to the first plurality of nMOS devices (642/648, 842/848, 942/948, 1042/1048) in a second direction orthogonal to the first direction. The first plurality of pMOS devices (652/658, 852/858, 952/958, 1052/1058) is spaced apart in the first direction. The first dummy pMOS cell (654, 854, 954, 1054) and the first n-tap cell (656, 856, 956, 1056) are adjacent to each other in the first direction between the first plurality of pMOS devices (652/658, 852/858, 952/958, 1052/1058). The first n-tap cell (656, 856, 956, 1056) is configured to be coupled to a second voltage source. The first p-tap cell (644, 844, 944, 1044) and the first dummy pMOS cell (654, 854, 954, 1054) are adjacent to each other in the second direction. The first dummy nMOS cell (646, 846, 946, 1046) and the first n-tap cell (656, 856, 956, 1056) are adjacent to each other in the second direction.

In one configuration, the MOS IC may further include a third circuit (696, 896, 996, 1096) including a second plurality of nMOS devices (662/668, 862/868, 962/968, 1062/1068), a second p-tap cell (664, 864, 964, 1064), and a second dummy nMOS cell (666, 866, 966, 1066). The second plurality of nMOS devices (662/668, 862/868, 962/968, 1062/1068) is spaced apart in the first direction. The second plurality of nMOS devices (662/668, 862/868, 962/968, 1062/1068) is adjacent to the first plurality of pMOS devices (652/658, 852/858, 952/958, 1052/1058) in the second direction. The second p-tap cell (664, 864, 964, 1064) and the second dummy nMOS cell (666, 866, 966, 1066) are adjacent to each other in the first direction between the second plurality of nMOS devices (662/668, 862/868, 962/968, 1062/1068). The first dummy pMOS cell (654, 854, 954, 1054) and the second p-tap cell (664, 864, 964, 1064) are adjacent to each other in the second direction. The first n-tap cell (656, 856, 956, 1056) and the second dummy nMOS cell (666, 866, 966, 1066) are adjacent to each other in the second direction. The second p-tap cell (664, 864, 964, 1064) is configured to be coupled to the first voltage source.

In one configuration, the first plurality of nMOS devices (642/648) includes a first set of nMOS devices (642) and a second set of nMOS devices (648). The first plurality of pMOS devices (652/658) includes a first set of pMOS devices (652) and a second set of pMOS devices (658). The second plurality of nMOS devices (662/668) includes a third set of nMOS devices (662) and a fourth set of nMOS devices (668). The second set of nMOS devices (648), the first dummy nMOS cell (646), the first n-tap cell (656), the second dummy nMOS cell (666), and the fourth set of nMOS devices (668) form an n-type C-shape (702) on the MOS IC with the second set of pMOS devices (658) located within the n-type C-shape (702). Note that the NP/PP layers form C-shapes 702, 704, 706, 708 in each of the configurations in association with FIGS. 6, 8, 9, 10.

In one configuration, the MOS IC may further include a fourth circuit (697, 897, 997, 1097) including a second plurality of pMOS devices (672/678, 872/878, 972/978, 1072/1078), a second dummy pMOS cell (674, 874, 974, 1074), and a second n-tap cell (676, 776, 876, 976). The second plurality of pMOS devices (672/678, 872/878, 972/978, 1072/1078) is spaced apart in the first direction. The second plurality of pMOS devices (672/678, 872/878, 972/978, 1072/1078) is adjacent to the second plurality of nMOS devices (662/668, 862/868, 962/968, 1062/1068) in the second direction. The second dummy pMOS cell (674, 874, 974, 1074) and the second n-tap cell (676, 776, 876, 976) are adjacent to each other in the first direction between the second plurality of pMOS devices (672/678, 872/878, 972/978, 1072/1078). The second p-tap cell (664, 864, 964, 1064) and the second dummy pMOS cell (674, 874, 974, 1074) are adjacent to each other in the second direction. The second dummy nMOS cell (666, 866, 966, 1066) and the second n-tap cell (676, 776, 876, 976) are adjacent to each other in the second direction. The second n-tap cell (676, 776, 876, 976) is configured to be coupled to the second voltage source.

In one configuration, the first plurality of nMOS devices (642/648) includes a first set of nMOS devices (642) and a second set of nMOS devices (648). The first plurality of pMOS devices (652/658) includes a first set of pMOS devices (652) and a second set of pMOS devices (658). The second plurality of nMOS devices (662/668) includes a third set of nMOS devices (662) and a fourth set of nMOS devices (668). The second plurality of pMOS devices (672/678) includes a third set of pMOS devices (672) and a fourth set of pMOS devices (678). The second set of nMOS devices (648), the first dummy nMOS cell (646), the first n-tap cell (656), the second dummy nMOS cell (666), and the fourth set of nMOS devices (668) form an n-type C-shape (702) on the MOS IC with the second set of pMOS devices (658) located within the n-type C-shape (702), The first set of pMOS devices (652), the first dummy pMOS cell (654), the second p-tap cell (664), the second dummy pMOS cell (674), and the third set of pMOS devices (672) form a p-type C-shape (704) on the MOS IC with the third set of nMOS devices (662) located within the p-type C-shape (704). Note that the NP/PP layers form C-shapes 702, 704, 706, 708 in each of the configurations in association with FIGS. 6, 8, 9, 10.

In one configuration, the MOS IC further includes a third circuit including a second plurality of pMOS devices (632/638, 832/838, 932/938, 1032/1038), a second dummy pMOS cell (634, 834, 934, 1034), and a second n-tap cell (636, 836, 936, 1036). The second plurality of pMOS devices (632/638, 832/838, 932/938, 1032/1038) is spaced apart in the first direction. The second plurality of pMOS devices (632/638, 832/838, 932/938, 1032/1038) is adjacent to the first plurality of nMOS devices (642/648, 842/848, 942/948, 1042/1048) in the second direction. The second dummy pMOS cell (634, 834, 934, 1034) and the second n-tap cell (636, 836, 936, 1036) are adjacent to each other in the first direction between the second plurality of pMOS devices (632/638, 832/838, 932/938, 1032/1038). The first p-tap cell (644, 844, 944, 1044) and the second dummy pMOS cell (634, 834, 934, 1034) are adjacent to each other in the second direction. The first dummy nMOS cell (646, 846, 946, 1046) and the second n-tap cell (636, 836, 936, 1036) are adjacent to each other in the second direction. The second n-tap cell (636, 836, 936, 1036) is configured to be coupled to the second voltage source.

In one configuration, the first plurality of nMOS devices (642/648) includes a first set of nMOS devices (642) and a second set of nMOS devices (648). The first plurality of pMOS devices (652/658) includes a first set of pMOS devices (652) and a second set of pMOS devices (658). The second plurality of pMOS devices (632/638) includes a third set of pMOS devices (632) and a fourth set of pMOS devices (638). The first set of pMOS devices (652), the first dummy pMOS cell (654), the first p-tap cell (644), the second dummy pMOS cell (634), and the third set of pMOS devices (632) form a p-type C-shape (708) on the MOS IC with the first set of nMOS devices (642) located within the p-type C-shape (708). Note that the NP/PP layers form C-shapes 702, 704, 706, 708 in each of the configurations in association with FIGS. 6, 8, 9, 10.

In one configuration, the MOS IC further includes a fourth circuit including a second plurality of nMOS devices (622/628, 822/828, 922/928, 1022/1028), a second p-tap cell (624, 824, 924, 1024), and a second dummy nMOS cell (626, 826, 926, 1026). The second plurality of nMOS devices (622/628, 822/828, 922/928, 1022/1028) is spaced apart in the first direction. The second plurality of nMOS devices (622/628, 822/828, 922/928, 1022/1028) is adjacent to the second plurality of pMOS devices (632/638, 832/838, 932/938, 1032/1038) in the second direction. The second p-tap cell (624, 824, 924, 1024) and the second dummy nMOS cell (626, 826, 926, 1026) are adjacent to each other in the first direction between the second plurality of nMOS devices (622/628, 822/828, 922/928, 1022/1028). The second p-tap cell (624, 824, 924, 1024) and the second dummy pMOS cell (634, 834, 934, 1034) are adjacent to each other in the second direction. The second dummy nMOS cell (626, 826, 926, 1026) and the second n-tap cell (636, 836, 936, 1036) are adjacent to each other in the second direction. The second p-tap cell (624, 824, 924, 1024) is configured to be coupled to the first voltage source.

In one configuration, the first plurality of nMOS devices (642/648) includes a first set of nMOS devices (642) and a second set of nMOS devices (648). The first plurality of pMOS devices (652/658) includes a first set of pMOS devices (652) and a second set of pMOS devices (658). The second plurality of pMOS devices (632/638) includes a third set of pMOS devices (632) and a fourth set of pMOS devices (638). The second plurality of nMOS devices (622/628) includes a third set of nMOS devices (622) and a fourth set of nMOS devices (628). The first set of pMOS devices (652), the first dummy pMOS cell (654), the first p-tap cell (644), the second dummy pMOS cell (634), and the third set of pMOS devices (632) form a p-type C-shape (708) on the MOS IC with the first set of nMOS devices (642) located within the p-type C-shape (708). The second set of nMOS devices (648), the first dummy nMOS cell (646), the second n-tap cell (636), the second dummy nMOS cell (626), and the fourth set of nMOS devices (628) form an n-type C-shape (706) on the MOS IC with the fourth set of pMOS devices (638) located within the n-type C-shape (706). Note that the NP/PP layers form C-shapes 702, 704, 706, 708 in each of the configurations in association with FIGS. 6, 8, 9, 10.

In one configuration, the first dummy nMOS cell (646, 846, 946, 1046) is configured to be one of floating, coupled to the first voltage source, and coupled to the second voltage source. In one configuration, the first dummy pMOS cell (654, 854, 954, 1054) is configured to be one of floating, coupled to the first voltage source, and coupled to the second voltage source.

Referring to FIG. 6, in one configuration, an area of each of the first p-tap cell (644), the first dummy nMOS cell (646), the first dummy pMOS cell (654), and the first n-tap cell (656) is approximately equal.

Referring to FIGS. 8, 9, in one configuration, an area of the first p-tap cell (844, 944) and the first n-tap cell (856, 956) is greater than an area of the first dummy pMOS cell (854, 954) and the first dummy nMOS cell (846, 946). Referring to FIG. 8, in one configuration, the first plurality of nMOS devices (842/848) are non-adjacent the first dummy pMOS cell (854) and the first n-tap cell (856) in the second direction, and the first plurality of pMOS devices (852/858) are non-adjacent the first p-tap cell (844) and the first dummy nMOS cell (846) in the second direction. Referring to FIG. 9, in one configuration, at least one nMOS device (948) of the first plurality of nMOS devices (942/948) is adjacent to the first n-tap cell (956) in the second direction, and at least one pMOS device (952) of the first plurality of pMOS devices (952/958) is adjacent to the first p-tap cell (944) in the second direction.

Referring to FIG. 10, in one configuration, the first plurality of nMOS devices (1042/1048) includes a first set of nMOS devices (1042) and a second set of nMOS devices (1048), and the first dummy nMOS cell (1046) and the second set of nMOS devices (1048) have a continuous OD region in the first direction.

Referring to FIGS. 6-9, in one configuration, the first plurality of nMOS devices (642/648, 842/848, 942/948) includes a first set of nMOS devices (642, 842, 942) and a second set of nMOS devices (648, 848, 948), and an OD region of the first dummy nMOS cell (646, 846, 946) and an OD region of the second set of nMOS devices (648, 848, 948) are discontinuous in the first direction with respect to each other.

Referring to FIG. 10, in one configuration, the first plurality of pMOS devices (1052/1058) includes a first set of pMOS devices (1052) and a second set of pMOS devices (1058), and the first set of pMOS devices (1052) and the first dummy pMOS cell (1054) have a continuous OD region in the first direction.

Referring to FIGS. 6-9, in one configuration, the first plurality of pMOS devices (652/658, 852/858, 952/958) includes a first set of pMOS devices (652, 852, 952) and a second set of pMOS devices (658, 858, 958), and an OD region of the first set of pMOS devices (652, 852, 952) and an OD region of the first dummy pMOS cell (654, 854, 954) are discontinuous in the first direction with respect to each other.

In one configuration, the second voltage source is higher than the first voltage source.

In one configuration, the first plurality of nMOS devices (642/648, 842/848, 942/948, 1042/1048) includes a first set of nMOS devices (642, 842, 942, 1042) and a second set of nMOS devices (648, 848, 948, 1048). As illustrated in FIG. 11, the first set of nMOS devices (642, 842, 942, 1042) and the second set of nMOS devices (648, 848, 948, 1048) each includes n rows of nMOS devices, where n≥1. The first plurality of pMOS devices (652/658, 852/858, 952/958, 1052/1058) includes a first set of pMOS devices (652, 852, 952, 1052) and a second set of pMOS devices (658, 858, 958, 1058). As illustrated in FIG. 11, the first set of pMOS devices (652, 852, 952, 1052) and the second set of pMOS devices (658, 858, 958, 1058) each includes m rows of pMOS devices, where m≥1. In one configuration, m is equal to n.

In one configuration, the first p-tap cell (644, 844, 944, 1044) includes n rows of p-tap cells, and the first dummy nMOS cell (646, 846, 946, 1046) includes n rows of dummy nMOS cells. In one configuration, the first dummy pMOS cell (654, 854, 954, 1054) includes m rows of dummy pMOS cells, and the first n-tap cell (656, 856, 956, 1056) includes m rows of n-tap cells.

As discussed above, for some fabrication processes, DRC violations may be encountered at four-corner areas where, clockwise or counterclockwise, NP, PP, NP, PP layers meet at one corner with 90° edges. With respect to FIGS. 4-11, multiple configurations of a dummy cell and tap cell layout structure are provided that avoid the corner case abutment DRC violations. Each of the multiple configurations of the dummy cell and tap cell layout structure include dummy nMOS/pMOS cells that, while increasing an overall size of the IC, also provide NP/PP layers in a configuration that avoid the corner case abutment DRC violations. By avoiding the corner case abutment DRC violations, yield/performance may be improved of corresponding fabricated MOS ICs.

It is understood that the specific order or hierarchy of steps in the processes disclosed is an illustration of exemplary approaches. Based upon design preferences, it is understood that the specific order or hierarchy of steps in the processes may be rearranged. Further, some steps may be combined or omitted. The accompanying method claims present elements of the various steps in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects." Unless specifically stated otherwise, the term "some" refers to one or more. Combinations such as "at least one of A, B, or C," "at least one of A, B, and C," and "A, B, C, or any combination thereof" include any combination of A, B, and/or C, and may include multiples of A, multiples of B, or multiples of C. Specifically, combinations such as "at least one of A, B, or C," "at least one of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

The following examples are illustrative only and may be combined with aspects of other embodiments or teachings described herein, without limitation.

Aspect 1 is a MOS IC that includes a first circuit including a first plurality of nMOS devices, a first p-tap cell, and a first dummy nMOS cell. The first plurality of nMOS devices is spaced apart in a first direction. The first p-tap cell and the first dummy nMOS cell are adjacent to each other in the first direction between the first plurality of nMOS devices. The first p-tap cell is configured to be coupled to a first voltage source. The MOS IC further includes a second circuit including a first plurality of pMOS devices, a first dummy pMOS cell, and a first n-tap cell. The first plurality of pMOS devices is adjacent to the first plurality of nMOS devices in a second direction orthogonal to the first direction. The first plurality of pMOS devices is spaced apart in the first direction. The first dummy pMOS cell and the first n-tap cell are adjacent to each other in the first direction between the first plurality of pMOS devices. The first n-tap cell is configured to be coupled to a second voltage source. The first p-tap cell and the first dummy pMOS cell are adjacent to each other in the second direction. The first dummy nMOS cell and the first n-tap cell are adjacent to each other in the second direction.

Aspect 2 is the MOS IC of aspect 1, further including a third circuit including a second plurality of nMOS devices, a second p-tap cell, and a second dummy nMOS cell. The second plurality of nMOS devices is spaced apart in the first direction. The second plurality of nMOS devices is adjacent to the first plurality of pMOS devices in the second direction. The second p-tap cell and the second dummy nMOS cell are adjacent to each other in the first direction between the second plurality of nMOS devices. The first dummy pMOS cell and the second p-tap cell are adjacent to each other in the second direction. The first n-tap cell and the second dummy nMOS cell are adjacent to each other in the second direction. The second p-tap cell is configured to be coupled to the first voltage source.

Aspect 3 is the MOS IC of aspect 2, wherein the first plurality of nMOS devices includes a first set of nMOS devices and a second set of nMOS devices. The first plurality of pMOS devices includes a first set of pMOS devices and a second set of pMOS devices. The second plurality of nMOS devices includes a third set of nMOS devices and a fourth set of nMOS devices. The second set of nMOS devices, the first dummy nMOS cell, the first n-tap cell, the second dummy nMOS cell, and the fourth set of nMOS devices form an n-type C-shape on the MOS IC with the second set of pMOS devices located within the n-type C-shape.

Aspect 4 is the MOS IC of any of aspects 2 to 3, further including a fourth circuit including a second plurality of pMOS devices, a second dummy pMOS cell, and a second n-tap cell. The second plurality of pMOS devices is spaced apart in the first direction. The second plurality of pMOS devices is adjacent to the second plurality of nMOS devices in the second direction. The second dummy pMOS cell and the second n-tap cell are adjacent to each other in the first direction between the second plurality of pMOS devices. The second p-tap cell and the second dummy pMOS cell are adjacent to each other in the second direction. The second dummy nMOS cell and the second n-tap cell are adjacent to each other in the second direction. The second n-tap cell is configured to be coupled to the second voltage source.

Aspect 5 is the MOS IC of aspect 4, wherein the first plurality of nMOS devices includes a first set of nMOS devices and a second set of nMOS devices. The first plurality of pMOS devices includes a first set of pMOS devices and a second set of pMOS devices. The second plurality of nMOS devices includes a third set of nMOS devices and a fourth set of nMOS devices. The second plurality of pMOS devices includes a third set of pMOS devices and a fourth set of pMOS devices. The second set of nMOS devices, the first dummy nMOS cell, the first n-tap cell, the second dummy nMOS cell, and the fourth set of nMOS devices form an n-type C-shape on the MOS IC with the second set of pMOS devices located within the n-type C-shape. The first set of pMOS devices, the first dummy pMOS cell, the second p-tap cell, the second dummy pMOS cell, and the third set of pMOS devices form a p-type C-shape on the MOS IC with the third set of nMOS devices located within the p-type C-shape.

Aspect 6 is the MOS IC of any of aspects 1 to 5, further including a third circuit including a second plurality of pMOS devices, a second dummy pMOS cell, and a second n-tap cell. The second plurality of pMOS devices is spaced apart in the first direction. The second plurality of pMOS devices is adjacent to the first plurality of nMOS devices in the second direction. The second dummy pMOS cell and the second n-tap cell are adjacent to each other in the first direction between the second plurality of pMOS devices. The first p-tap cell and the second dummy pMOS cell are adjacent to each other in the second direction. The first dummy nMOS cell and the second n-tap cell are adjacent to each other in the second direction. The second n-tap cell is configured to be coupled to the second voltage source.

Aspect 7 is the MOS IC of aspect 6, wherein the first plurality of nMOS devices includes a first set of nMOS devices and a second set of nMOS devices. The first plurality of pMOS devices includes a first set of pMOS devices and a second set of pMOS devices. The second plurality of pMOS devices includes a third set of pMOS devices and a fourth set of pMOS devices. The first set of pMOS devices, the first dummy pMOS cell, the first p-tap cell, the second dummy pMOS cell, and the third set of pMOS devices form a p-type C-shape on the MOS IC with the first set of nMOS devices located within the p-type C-shape.

Aspect 8 is the MOS IC of any of aspects 6 to 7, further including a fourth circuit including a second plurality of nMOS devices, a second p-tap cell, and a second dummy nMOS cell. The second plurality of nMOS devices is spaced apart in the first direction. The second plurality of nMOS devices is adjacent to the second plurality of pMOS devices in the second direction. The second p-tap cell and the second dummy nMOS cell are adjacent to each other in the first direction between the second plurality of nMOS devices. The second p-tap cell and the second dummy pMOS cell are adjacent to each other in the second direction. The second dummy nMOS cell and the second n-tap cell are adjacent to each other in the second direction. The second p-tap cell is configured to be coupled to the first voltage source.

Aspect 9 is the MOS IC of aspect 8, wherein the first plurality of nMOS devices includes a first set of nMOS devices and a second set of nMOS devices. The first plurality of pMOS devices includes a first set of pMOS devices and a second set of pMOS devices. The second plurality of pMOS devices includes a third set of pMOS devices and a fourth set of pMOS devices. The second plurality of nMOS devices includes a third set of nMOS devices and a fourth set of nMOS devices. The first set of pMOS devices, the first dummy pMOS cell, the first p-tap cell, the second dummy pMOS cell, and the third set of pMOS devices form a p-type C-shape on the MOS IC with the first set of nMOS devices located within the p-type C-shape. The second set of nMOS devices, the first dummy nMOS cell, the second n-tap cell, the second dummy nMOS cell, and the fourth set of nMOS devices form an n-type C-shape on the MOS IC with the fourth set of pMOS devices located within the n-type C-shape.

Aspect 10 is the MOS IC of any of aspects 1 to 9, wherein the first dummy nMOS cell is configured to be one of floating, coupled to the first voltage source, and coupled to the second voltage source.

Aspect 11 is the MOS IC of any of aspects 1 to 10, wherein the first dummy pMOS cell is configured to be one of floating, coupled to the first voltage source, and coupled to the second voltage source.

Aspect 12 is the MOS IC of any of aspects 1 to 11, wherein an area of each of the first p-tap cell, the first dummy nMOS cell, the first dummy pMOS cell, and the first n-tap cell is approximately equal.

Aspect 13 is the MOS IC of any of aspects 1 to 11, wherein an area of the first p-tap cell and the first n-tap cell is greater than an area of the first dummy pMOS cell and the first dummy nMOS cell.

Aspect 14 is the MOS IC of aspect 13, wherein the first plurality of nMOS devices are non-adjacent the first dummy pMOS cell and the first n-tap cell in the second direction, and the first plurality of pMOS devices are non-adjacent the first p-tap cell and the first dummy nMOS cell in the second direction.

Aspect 15 is the MOS IC of aspect 13, wherein at least one nMOS device of the first plurality of nMOS devices is adjacent to the first n-tap cell in the second direction, and at least one pMOS device of the first plurality of pMOS devices is adjacent to the first p-tap cell in the second direction.

Aspect 16 is the MOS IC of any of aspects 1 to 14, wherein the first plurality of nMOS devices includes a first set of nMOS devices and a second set of nMOS devices, and the first dummy nMOS cell and the second set of nMOS devices have a continuous OD region in the first direction.

Aspect 17 is the MOS IC of any of aspects 1 to 15, wherein the first plurality of nMOS devices includes a first set of nMOS devices and a second set of nMOS devices, and an OD region of the first dummy nMOS cell and an OD region of the second set of nMOS devices are discontinuous in the first direction with respect to each other.

Aspect 18 is the MOS IC of any of aspects 1 to 14, and 16, wherein the first plurality of pMOS devices includes a first set of pMOS devices and a second set of pMOS devices, and the first set of pMOS devices and the first dummy pMOS cell have a continuous OD region in the first direction.

Aspect 19 is the MOS IC of any of aspects 1 to 15, and 17, wherein the first plurality of pMOS devices includes a first set of pMOS devices and a second set of pMOS devices, and an OD region of the first set of pMOS devices and an OD region of the first dummy pMOS cell are discontinuous in the first direction with respect to each other.

Aspect 20 is the MOS IC of any of aspects 1 to 19, wherein the second voltage source is higher than the first voltage source.

Aspect 21 is the MOS IC of any of aspects 1 to 20, wherein the first plurality of nMOS devices includes a first set of nMOS devices and a second set of nMOS devices. The first set of nMOS devices and the second set of nMOS devices each includes n rows of nMOS devices, where n≥1. The first plurality of pMOS devices includes a first set of pMOS devices and a second set of pMOS devices. The first set of pMOS devices and the second set of pMOS devices each includes m rows of pMOS devices, where m≥1.

Aspect 22 is the MOS IC of aspect 21, wherein m is equal to n.

Aspect 23 is the MOS IC of any of aspects 21 and 22, wherein the first p-tap cell includes n rows of p-tap cells, and the first dummy nMOS cell includes n rows of dummy nMOS cells.

Aspect 24 is the MOS IC of any of aspects 21 to 23, wherein the first dummy pMOS cell includes m rows of dummy pMOS cells, and the first n-tap cell includes m rows of n-tap cells.

What is claimed is:
1. A metal oxide semiconductor (MOS) integrated circuit (IC), comprising:
 a first circuit including a first plurality of n-type MOS (nMOS) devices, a first p-type tap (p-tap) cell, and a first dummy nMOS cell, the first plurality of nMOS devices being spaced apart in a first direction, the first p-tap cell and the first dummy nMOS cell being adjacent to each other in the first direction between the first plurality of nMOS devices, the first p-tap cell being configured to be coupled to a first voltage source; and
 a second circuit including a first plurality of p-type MOS (pMOS) devices, a first dummy pMOS cell, and a first n-type tap (n-tap) cell, the first plurality of pMOS devices being adjacent to the first plurality of nMOS devices in a second direction orthogonal to the first direction, the first plurality of pMOS devices being spaced apart in the first direction, the first dummy pMOS cell and the first n-tap cell being adjacent to each other in the first direction between the first plurality of pMOS devices, the first n-tap cell being configured to be coupled to a second voltage source, the first p-tap cell and the first dummy pMOS cell being adjacent to each other in the second direction, the first dummy nMOS cell and the first n-tap cell being adjacent to each other in the second direction.

2. The MOS IC of claim 1, further comprising a third circuit including a second plurality of nMOS devices, a second p-tap cell, and a second dummy nMOS cell, wherein the second plurality of nMOS devices is spaced apart in the first direction, the second plurality of nMOS devices is adjacent to the first plurality of pMOS devices in the second direction, the second p-tap cell and the second dummy nMOS cell are adjacent to each other in the first direction between the second plurality of nMOS devices, the first dummy pMOS cell and the second p-tap cell are adjacent to each other in the second direction, the first n-tap cell and the second dummy nMOS cell are adjacent to each other in the second direction, and the second p-tap cell is configured to be coupled to the first voltage source.

3. The MOS IC of claim 2, wherein the first plurality of nMOS devices comprises a first set of nMOS devices and a second set of nMOS devices, the first plurality of pMOS devices comprises a first set of pMOS devices and a second set of pMOS devices, and the second plurality of nMOS devices comprises a third set of nMOS devices and a fourth set of nMOS devices, and wherein the second set of nMOS devices, the first dummy nMOS cell, the first n-tap cell, the second dummy nMOS cell, and the fourth set of nMOS devices form an n-type C-shape on the MOS IC with the second set of pMOS devices located within the n-type C-shape.

4. The MOS IC of claim 2, further comprising a fourth circuit including a second plurality of pMOS devices, a second dummy pMOS cell, and a second n-tap cell, wherein the second plurality of pMOS devices is spaced apart in the first direction, the second plurality of pMOS devices is adjacent to the second plurality of nMOS devices in the second direction, the second dummy pMOS cell and the second n-tap cell are adjacent to each other in the first direction between the second plurality of pMOS devices, the second p-tap cell and the second dummy pMOS cell are adjacent to each other in the second direction, the second dummy nMOS cell and the second n-tap cell are adjacent to each other in the second direction, and the second n-tap cell is configured to be coupled to the second voltage source.

5. The MOS IC of claim 4, wherein the first plurality of nMOS devices comprises a first set of nMOS devices and a second set of nMOS devices, the first plurality of pMOS devices comprises a first set of pMOS devices and a second set of pMOS devices, the second plurality of nMOS devices comprises a third set of nMOS devices and a fourth set of nMOS devices, and the second plurality of pMOS devices comprises a third set of pMOS devices and a fourth set of pMOS devices, and wherein the second set of nMOS devices, the first dummy nMOS cell, the first n-tap cell, the second dummy nMOS cell, and the fourth set of nMOS devices form an n-type C-shape on the MOS IC with the second set of pMOS devices located within the n-type C-shape, and wherein the first set of pMOS devices, the first dummy pMOS cell, the second p-tap cell, the second dummy pMOS cell, and the third set of pMOS devices form a p-type C-shape on the MOS IC with the third set of nMOS devices located within the p-type C-shape.

6. The MOS IC of claim 1, further comprising a third circuit including a second plurality of pMOS devices, a second dummy pMOS cell, and a second n-tap cell, wherein the second plurality of pMOS devices is spaced apart in the first direction, the second plurality of pMOS devices is adjacent to the first plurality of nMOS devices in the second direction, the second dummy pMOS cell and the second n-tap cell are adjacent to each other in the first direction between the second plurality of pMOS devices, the first p-tap cell and the second dummy pMOS cell are adjacent to each other in the second direction, the first dummy nMOS cell and the second n-tap cell are adjacent to each other in the second direction, and the second n-tap cell is configured to be coupled to the second voltage source.

7. The MOS IC of claim 6, wherein the first plurality of nMOS devices comprises a first set of nMOS devices and a second set of nMOS devices, the first plurality of pMOS devices comprises a first set of pMOS devices and a second set of pMOS devices, and the second plurality of pMOS devices comprises a third set of pMOS devices and a fourth set of pMOS devices, and wherein the first set of pMOS devices, the first dummy pMOS cell, the first p-tap cell, the second dummy pMOS cell, and the third set of pMOS devices form a p-type C-shape on the MOS IC with the first set of nMOS devices located within the p-type C-shape.

8. The MOS IC of claim 6, further comprising a fourth circuit including a second plurality of nMOS devices, a second p-tap cell, and a second dummy nMOS cell, wherein the second plurality of nMOS devices is spaced apart in the first direction, the second plurality of nMOS devices is adjacent to the second plurality of pMOS devices in the second direction, the second p-tap cell and the second dummy nMOS cell are adjacent to each other in the first direction between the second plurality of nMOS devices, the second p-tap cell and the second dummy pMOS cell are adjacent to each other in the second direction, the second dummy nMOS cell and the second n-tap cell are adjacent to each other in the second direction, and the second p-tap cell is configured to be coupled to the first voltage source.

9. The MOS IC of claim 8, wherein the first plurality of nMOS devices comprises a first set of nMOS devices and a second set of nMOS devices, the first plurality of pMOS devices comprises a first set of pMOS devices and a second set of pMOS devices, the second plurality of pMOS devices comprises a third set of pMOS devices and a fourth set of pMOS devices, and the second plurality of nMOS devices comprises a third set of nMOS devices and a fourth set of nMOS devices, and wherein the first set of pMOS devices, the first dummy pMOS cell, the first p-tap cell, the second dummy pMOS cell, and the third set of pMOS devices form a p-type C-shape on the MOS IC with the first set of nMOS devices located within the p-type C-shape, and wherein the second set of nMOS devices, the first dummy nMOS cell, the second n-tap cell, the second dummy nMOS cell, and the fourth set of nMOS devices form an n-type C-shape on the MOS IC with the fourth set of pMOS devices located within the n-type C-shape.

10. The MOS IC of claim 1, wherein the first dummy nMOS cell is configured to be one of floating, coupled to the first voltage source, and coupled to the second voltage source.

11. The MOS IC of claim 1, wherein the first dummy pMOS cell is configured to be one of floating, coupled to the first voltage source, and coupled to the second voltage source.

12. The MOS IC of claim 1, wherein an area of each of the first p-tap cell, the first dummy nMOS cell, the first dummy pMOS cell, and the first n-tap cell is approximately equal.

13. The MOS IC of claim 1, wherein an area of the first p-tap cell and the first n-tap cell is greater than an area of the first dummy pMOS cell and the first dummy nMOS cell.

14. The MOS IC of claim 13, wherein the first plurality of nMOS devices are non-adjacent the first dummy pMOS cell and the first n-tap cell in the second direction, and the first plurality of pMOS devices are non-adjacent the first p-tap cell and the first dummy nMOS cell in the second direction.

15. The MOS IC of claim 13, wherein at least one nMOS device of the first plurality of nMOS devices is adjacent to the first n-tap cell in the second direction, and at least one pMOS device of the first plurality of pMOS devices is adjacent to the first p-tap cell in the second direction.

16. The MOS IC of claim 1, wherein the first plurality of nMOS devices comprises a first set of nMOS devices and a second set of nMOS devices, and the first dummy nMOS cell and the second set of nMOS devices have a continuous oxide diffusion (OD) region in the first direction.

17. The MOS IC of claim 1, wherein the first plurality of nMOS devices comprises a first set of nMOS devices and a second set of nMOS devices, and an oxide diffusion (OD) region of the first dummy nMOS cell and an OD region of the second set of nMOS devices are discontinuous in the first direction with respect to each other.

18. The MOS IC of claim 1, wherein the first plurality of pMOS devices comprises a first set of pMOS devices and a second set of pMOS devices, and the first set of pMOS devices and the first dummy pMOS cell have a continuous oxide diffusion (OD) region in the first direction.

19. The MOS IC of claim 1, wherein the first plurality of pMOS devices comprises a first set of pMOS devices and a second set of pMOS devices, and an oxide diffusion (OD) region of the first set of pMOS devices and an OD region of the first dummy pMOS cell are discontinuous in the first direction with respect to each other.

20. The MOS IC of claim 1, wherein the second voltage source is higher than the first voltage source.

21. The MOS IC of claim 1, wherein the first plurality of nMOS devices comprises a first set of nMOS devices and a second set of nMOS devices, the first set of nMOS devices and the second set of nMOS devices each comprises n rows of nMOS devices, where n≥1, and wherein the first plurality of pMOS devices comprises a first set of pMOS devices and a second set of pMOS devices, the first set of pMOS devices and the second set of pMOS devices each comprises m rows of pMOS devices, where m≥1.

22. The MOS IC of claim 21, wherein m is equal to n.

23. The MOS IC of claim 21, wherein the first p-tap cell comprises n rows of p-tap cells, and the first dummy nMOS cell comprises n rows of dummy nMOS cells.

24. The MOS IC of claim 21, wherein the first dummy pMOS cell comprises m rows of dummy pMOS cells, and the first n-tap cell comprises m rows of n-tap cells.

* * * * *